(12) United States Patent
Prabhakar

(10) Patent No.: US 8,859,403 B2
(45) Date of Patent: *Oct. 14, 2014

(54) SYSTEMS, METHODS AND MATERIALS INCLUDING CRYSTALLIZATION OF SUBSTRATES VIA SUB-MELT LASER ANNEAL, AS WELL AS PRODUCTS PRODUCED BY SUCH PROCESSES

(71) Applicant: GigaSi Solar, Pleasanton, CA (US)

(72) Inventor: Venkatraman Prabhakar, Pleasanton, CA (US)

(73) Assignee: GigaSi Solar, Inc., Pleasanton, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/750,932

(22) Filed: Jan. 25, 2013

(65) Prior Publication Data

US 2014/0021477 A1    Jan. 23, 2014

Related U.S. Application Data

(63) Continuation of application No. 12/845,691, filed on Jul. 28, 2010, now Pat. No. 8,361,890.

(60) Provisional application No. 61/271,897, filed on Jul. 28, 2009.

(51) Int. Cl.
*H01L 21/20* (2006.01)
*H01L 31/0368* (2006.01)
(Continued)

(52) U.S. Cl.
CPC ........ *H01L 29/786* (2013.01); *H01L 31/03682* (2013.01); *H01L 21/0237* (2013.01); *H01L 21/02532* (2013.01); *H01L 21/76871* (2013.01); *H01L 31/03762* (2013.01); *H01L 21/02675* (2013.01); *H01L 21/02686* (2013.01); *H01L 21/02667* (2013.01); *H01L 2221/1084* (2013.01); *H01L 21/0245* (2013.01); *Y02E 10/547* (2013.01); *H01L 21/02529* (2013.01); *Y02E 10/546* (2013.01); *H01L 21/268* (2013.01); *H01L 31/028* (2013.01); *H01L 31/068* (2013.01); *H01L 2221/1089* (2013.01); *Y02E 10/548* (2013.01)

USPC .......................................................... 438/487

(58) Field of Classification Search
CPC .................. H01L 21/02675; H01L 21/02686; H01L 21/76871; H01L 31/068; H01L 2221/1084; H01L 2221/1089; Y02E 10/546; Y02E 10/547; Y02E 10/548
USPC .................... 438/487; 257/E29.292, E21.497
See application file for complete search history.

(56) References Cited

U.S. PATENT DOCUMENTS

| 4,309,225 A | 1/1982 | Fan et al. |
| 4,927,770 A | 5/1990 | Swanson |

(Continued)

FOREIGN PATENT DOCUMENTS

| DE | 1020070084540 A1 | 8/2008 |
| JP | 2005-175399 | 6/2005 |

(Continued)

OTHER PUBLICATIONS

Claim recitation for co-pending U.S. Appl. No. 12/857,549, filed Aug. 21, 2013.*

(Continued)

*Primary Examiner* — Tom Thomas
*Assistant Examiner* — Christopher M Roland
(74) *Attorney, Agent, or Firm* — DLA Piper LLP (US)

(57) ABSTRACT

Systems, methods, and products of processes consistent with the innovations herein relate to aspects involving crystallization of layers on substrates. In one exemplary implementation, there is provided a method of fabricating a device. Moreover, such method may include placing an amorphous/poly material on a substrate and heating the material via a sub-melt laser anneal process to transform the material into crystalline form.

56 Claims, 17 Drawing Sheets

(51) Int. Cl.

| | |
|---|---|
| H01L 21/02 | (2006.01) |
| H01L 21/768 | (2006.01) |
| H01L 31/0376 | (2006.01) |
| H01L 29/786 | (2006.01) |
| H01L 21/268 | (2006.01) |
| H01L 31/028 | (2006.01) |
| H01L 31/068 | (2012.01) |

(56) References Cited

U.S. PATENT DOCUMENTS

| | | | |
|---|---|---|---|
| 4,933,022 | A | 6/1990 | Swanson |
| 5,053,083 | A | 10/1991 | Sinton |
| 5,374,564 | A | 12/1994 | Bruel |
| 5,466,638 | A | 11/1995 | Eguchi |
| 6,020,252 | A | 2/2000 | Aspar et al. |
| 6,222,209 | B1 | 4/2001 | Antich et al. |
| 6,241,817 | B1 | 6/2001 | Jang et al. |
| 6,372,609 | B1 | 4/2002 | Aga et al. |
| 6,620,645 | B2 | 9/2003 | Chandra et al. |
| 6,927,417 | B2 | 8/2005 | Nagashima et al. |
| 7,119,365 | B2 | 10/2006 | Takafuji et al. |
| 7,217,636 | B1 | 5/2007 | Atanackovic |
| 7,396,744 | B2 | 7/2008 | Son et al. |
| 7,826,700 | B2 | 11/2010 | Knights et al. |
| 7,863,611 | B2 | 1/2011 | Abe et al. |
| 7,897,471 | B2 | 3/2011 | Hao |
| 8,008,726 | B2 | 8/2011 | Jou et al. |
| 8,110,479 | B2 | 2/2012 | Yamazaki |
| 8,211,780 | B2 | 7/2012 | Yamazaki |
| 8,361,890 | B2 * | 1/2013 | Prabhakar .................. 438/487 |
| 2001/0038096 | A1 | 11/2001 | Fukushima |
| 2002/0050593 | A1 | 5/2002 | Fukunaga et al. |
| 2002/0160553 | A1 | 10/2002 | Yamanaka et al. |
| 2003/0183876 | A1 | 10/2003 | Takafuji et al. |
| 2004/0056332 | A1 | 3/2004 | Bachrach et al. |
| 2004/0125421 | A1 | 7/2004 | Sato |
| 2004/0217423 | A1 | 11/2004 | Park et al. |
| 2004/0241960 | A1 | 12/2004 | Marurice et al. |
| 2004/0255845 | A1 | 12/2004 | Vousta et al. |
| 2005/0172888 | A1 | 8/2005 | Gosain et al. |
| 2006/0121691 | A1 | 6/2006 | Noguchi et al. |
| 2006/0264004 | A1 | 11/2006 | Tong et al. |
| 2007/0032040 | A1 | 2/2007 | Lederer |
| 2007/0054466 | A1 | 3/2007 | Hebras |
| 2007/0125421 | A1 | 6/2007 | Park et al. |
| 2007/0281172 | A1 | 12/2007 | Couillard et al. |
| 2008/0017243 | A1 | 1/2008 | De Ceuster et al. |
| 2008/0121264 | A1 | 5/2008 | Chen et al. |
| 2008/0188011 | A1 | 8/2008 | Henley |
| 2008/0196761 | A1 | 8/2008 | Nakano et al. |
| 2008/0251126 | A1 | 10/2008 | Yamazaki et al. |
| 2008/0280420 | A1 | 11/2008 | Yamazaki |
| 2008/0295885 | A1 | 12/2008 | Lee |
| 2008/0308143 | A1 | 12/2008 | Atanackovic |
| 2009/0081844 | A1 | 3/2009 | Yamazaki |
| 2009/0098709 | A1 | 4/2009 | Ohnuma et al. |
| 2009/0120924 | A1 | 5/2009 | Moffatt et al. |
| 2009/0130795 | A1 | 5/2009 | Im |
| 2009/0255572 | A1 | 10/2009 | Oswald |
| 2009/0255585 | A1 | 10/2009 | Shaikh et al. |
| 2009/0321884 | A1 | 12/2009 | Faure et al. |
| 2010/0093153 | A1 | 4/2010 | Koyama et al. |
| 2010/0248413 | A1 | 9/2010 | Strand et al. |
| 2010/0304151 | A1 | 12/2010 | Tuennermann et al. |
| 2011/0089420 | A1 | 4/2011 | Prabhakar |
| 2011/0089429 | A1 | 4/2011 | Prabhakar |
| 2011/0101364 | A1 | 5/2011 | Prabhakar |
| 2011/0165721 | A1 | 7/2011 | Prabhakar |
| 2011/0214708 | A1 | 9/2011 | Yago |
| 2011/0306180 | A1 | 12/2011 | Prabhakar |
| 2011/0318941 | A1 | 12/2011 | Schmidt et al. |
| 2012/0012166 | A1 | 1/2012 | Atanackovic |
| 2012/0018733 | A1 | 1/2012 | Prabhakar |

FOREIGN PATENT DOCUMENTS

| | | |
|---|---|---|
| KR | 10-2003-0077410 A | 10/2003 |
| KR | 10-2004-0093949 A | 11/2004 |
| KR | 10-2007-0067394 A | 6/2007 |
| WO | WO 2008/039078 | 4/2008 |

OTHER PUBLICATIONS

Claim recitation for co-pending U.S. Appl. No. 13/190,457, filed Aug. 28, 2013.*
U.S. Appl. No. 13/160,476, filed Jun. 2011, Prabhakar.
U.S. Appl. No. 13/190,457, filed Jul. 2011, Prabhakar.
Claim Recitation U.S. Appl. No. 12/842,996, filed Jan. 3, 2011.
Claim Recitation U.S. Appl. No. 12/857,549, filed Jan. 3, 2011.
International Preliminary Report on Patentability dated Feb. 2, 2012, in counterpart PCT Application No. PCT/US2010/043164.
International Search Report and Written Opinion dated Feb. 28, 2011, in counterpart PCT Application No. PCT/US2010/043164.
International Preliminary Report on Patentability dated Feb. 9, 2012, in counterpart PCT Application No. PCT/US2010/043600.
International Preliminary Report on Patentability dated Jan. 24, 2012, in counterpart PCT Application No. PCT/US2010/043164.
International Preliminary Report on Patentability dated Jan. 31, 2012, in counterpart PCT Application No. PCT/US2010/043600.
International Search Report and Written Opinion dated Mar. 28, 2011, in counterpart PCT Application No. PCT/US2010/043600.
International Search Report dated May 26, 2011, in counterpart PCT Application No. PCT/US2010/045672.
International Search Report dated Aug. 30, 2011 in counterpart PCT Application No. PCT/US2010/058138.
International Search Report dated Feb. 29, 2012, in counterpart PCT Application No. PCT/US2011/040404.
Buh et al., Integration of Sub-melt Laser Annealing on Metal Gate CMOS Devices for Sub 50 nm Node DRAM, Electron Devices Meeting, IEDM International 2006, San Francisco, CA, Dec. 11-13, 2006, pp. 1-4.
Carlson, Amorphous Silicon Solar Cells, IEEE Transactions on Electron Devices, Apr. 1977, pp. 449-453, vol. ED-24, No. 4, IEEE, USA.
Crowder et al., Low-Temperature Single-Crystal Si TFT's Fabricated on Si Films Processed via Sequential Lateral Solidification, IEEE Electron Device Letters, Aug. 1998, pp. 306-308, vol. 19, No. 8, IEEE, USA.
Izmajlowicz et al., Directional Nickel-induced Fielded Aided Lateral Crystallization of Amorphous Silicon, Journal of Applied Physics, Dec. 15, 2003, pp. 7535-7541, vol. 94, No. 12, American Institute of Physics, USA.
McCann, Michelle et al., A Review of Thin Film Silicon for Solar Cells Applications, published online by ANU Research 2004 (see http://hdl.handle.net/1885/40839), pp. 1-23.
Park, et al., Integration of Single-Crystal LiNb03 Thin Film on Silicon by Laser Irradiation and Ion-Implantation-Induced Layer Transfer, Advanced Materials, 2006, 18, pp. 1533-1536.
Park et al., Transmission Laser Bonding of Glass With Silicon Wafer, Proceedings of 2004 JUSFA (2004), pp. 1-7.
Park, et al., Line Bonding of Wafers Using Transmission Laser Bonding Technique for Microsystem Packaging, IEEE (2006), pp. 1358-1364.
Rao et al., Investigations of LPCVD-ZnO Front Contact TCO on Large Area for Amorphous Silicon Solar Cell Applications, Photovoltaic Specialists Conference 2008, San Diego, CA, May 11-16, 2008, pp. 1-4.
Sinton, Simplified Backside-Contact Solar Cells, IEEE Transactions on Electron Devices, Feb. 1990, pp. 348-352, vol. 37, No. 2, IEEE, USA.
Tamagawa et al., Green Laser Annealing System for Manufacturing LTPS TFTs, ULVAC Technical Journal (English), 2006, pp. 32-36, No. 64E, ULVAC.
Tseng et al., Effects of Surface Roughness and Contact Pressure on Wafer Bonding Strength Using Transmission Laser Bonding Technique, J. Microlith., Microfab., Microsyst. 5,4 (2006), pp. 1-11.

(56) References Cited

OTHER PUBLICATIONS

Tseng, et al., Mechanical Strength and Interface Characteristics of Transmission Laser Bonding, IEEE 29, 3 (2006), pp. 191-201.

Tseng, et al., Using Transmission Laser Bonding Technique for Line Bonding in Microsystems Packaging,: IEEE Transactions on Electronics Packaging Manufacturing, Oct. 2006, vol. 29, No. 4, pp. 308-318.

\* cited by examiner

SYSTEMS, METHODS AND MATERIALS INCLUDING CRYSTALLIZATION OF SUBSTRATES VIA SUB-MELT LASER ANNEAL, AS WELL AS PRODUCTS PRODUCED BY SUCH PROCESSES

CROSS-REFERENCE TO RELATED APPLICATIONS

This is a continuation of application Ser. No. 12/845,691, filed Jul. 28, 2010, Publication No. US2001/0101364 A1, now U.S. Pat. No. 8,361,890, which claims benefit and priority to U.S. provisional patent application No. 61/271,897, filed Jul. 28, 2009, which are incorporated herein by reference in entirety. This application also bears relation to application Ser. No. 12/842,996, filed Jul. 23, 2010, published as US2011/0089429 A1, and Ser. No. 12/857,549, filed Aug. 16, 2010, published as US2011/0089420 A1, which are also incorporated herein by reference in entirety and attached hereto as appendices.

BACKGROUND

1. Field

Systems and methods related to crystallization of layers on substrates, for example silicon/silicon-containing layers on substrates such as glass, are disclosed.

2. Description of Related Information

Known technologies have included crystallizing amorphous/poly silicon on glass. Some disclosures, for example, teach melting of amorphous silicon and re-crystallization without a seed layer. These methods may use excimer lasers, such as in wide use in the LCD/TFT display industry.

Other existing methods describe sub-melt anneal of silicon wafers. These techniques, however, pertain to full silicon wafers (without glass substrates) and are used for annealing regions such as source/drain junctions in advanced CMOS technology.

One problem of such melt and re-solidification techniques is that they generally involve processes that cause high stresses, which are unsuitable for silicon films. These drawbacks often limit the grain size and film quality achievable by such techniques. Here, for example, sub-melt anneal of silicon wafers is typically accomplished by a $CO_2$ laser which has a very large absorption depth. Accordingly, these techniques cannot be used for thin films on substrates such as glass, inter alia, because they would damage the substrate during anneal.

As set forth below, one or more exemplary aspects of the present inventions may overcome such drawbacks and/or otherwise impart innovations consistent with the systems and methods herein via crystallizing layers or films on substrates involving sub-melt features, achieving layers or films of reduced defects and stress, etc.

SUMMARY

Systems, methods, and products of processes consistent with the innovations herein relate to aspects including crystallization of layers on substrates.

In one exemplary implementation, there is provided a method of fabricating a device. Moreover, such method may include placing an amorphous/poly material on a substrate and heating the material via a sub-melt laser anneal process to transform the material into crystalline form.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

DESCRIPTION OF THE DRAWINGS

The accompanying drawings, which constitute a part of this specification, illustrate various implementations and aspects of the present invention and, together with the description, explain the principles of the invention. In the drawings.

DETAILED DESCRIPTION OF EXEMPLARY IMPLEMENTATIONS

Reference will now be made in detail to the invention, examples of which are illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

Systems and methods including crystallization of layers on substrates, such as silicon or silicon-containing layers on glass, are disclosed. Consistent with the disclosure herein, techniques that may include use of sub-melt laser anneal, e.g., high repetition rate lasers, CW (continuous wave) laser, etc., targeted not to melt the layer or layers to be crystallized, are provided. According to some exemplary implementations, a seed layer may optionally be placed on the substrate, followed by application/deposition of amorphous or polysilicon material for heating or laser anneal.

Figure 1:
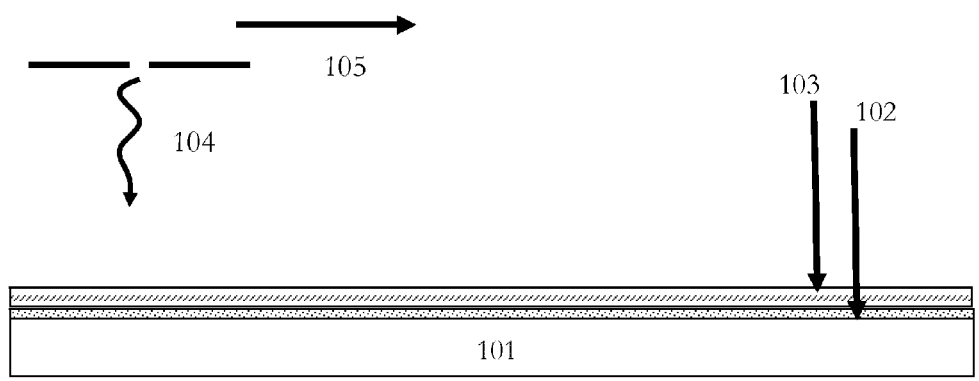
FIG. 1 illustrates an exemplary substrate with coating layers thereon, consistent with aspects related to the innovations herein.

FIG. 1 is a cross-section of an exemplary substrate, consistent with one or more aspects related to the innovations herein. As shown by way of example in FIG. 1, a substrate 101 such as glass, may be coated with an optional anti-reflective/stress relief layer 102. According to some implementations of the innovations herein, the layer 112 may be a layer of SiN, SiO2 or SiON, as explained in more detail below. Next, an amorphous/poly layer 103 such as a silicon containing layer may be deposited on top of the first layer/coating 102. In exemplary implementations, this next layer 103 may be amorphous silicon. Further, in some implementations, the amorphous/poly layer or amorphous silicon may have reduced hydrogen content. Here, for example, the reduced hydrogen content may be achieved by adjustment of the deposition method, such as using different gases or gas ratios in the deposition chamber and/or by adding a post-deposition anneal to drive out the hydrogen. A laser 104 may then be applied, such as to provide a sub-melt laser anneal process, and scanned 105 across the substrate 101.

The sub-melt laser anneal techniques herein The laser anneal is limited to a power or energy density to avoid melting the silicon layer. In the preferred embodiment, the laser is a pulsed laser with a high repetition rate. Each pulse is limited to an energy so that the silicon does not melt. The laser heats up the amorphous silicon and with the optimized scan speed and laser power, crystallizes the amorphous silicon layer. This crystallization process improves the film quality. Typical film quality parameters that are improved are grain size, recombination lifetime, mobility and diffusion length. In this invention, crystallization is used to convert some of the material to crystalline phase. In different embodiments the amount of crystallization desired may vary depending on the application. However, any amount of crystallization using a sub-melt laser anneal is encompassed by this invention.

This invention is not limited to particular laser wavelengths or optics needed to create certain spot sizes and shapes, such as a line source or other shapes. The invention will encompass all these variations as long as the energy density does not melt and re-crystallize the silicon, but instead crystallizes it in the solid phase.

The present disclosure is initially directed to aspects associated with methods and products involving sub-melt laser anneal techniques. Various other steps, products and processes related to the sub-melt laser anneal innovations set forth herein are also disclosed, as described in more detail beginning with FIG. 7A. These implementations, for example, may include bonding a seed layer of crystalline silicon which can be a wafer, or a part of a silicon wafer, on glass. Further, these implementations may also have another layer, for instance and anti-reflective coating, deposited before bonding the seed layer. The seed layer may also be affixed to the glass sheet by methods other than silicon bonding, such as with a glue layer. Alternative implementations include placing the silicon layer on the substrate using mechanical means such as mechanical pressure, vacuum etc.

Detail of these, and other, exemplary implementations are set forth in connection with FIGS. 7A-12. Some applications consistent with the innovations herein include solar cells (FIGS. 13-15) and flat panel displays (FIG. 16), such as LCD displays and LED displays or OLED displays. However, the innovations herein are not limited to just such exemplary applications, but can be used for other applications as well.

Some of the disclosure herein uses the terms 'amorphous layers' or 'amorphous silicon', such as when describing crystallization of such layers using a silicon seed layer. However, the innovations herein are not limited to just amorphous layer(s), i.e., such layer could be poly crystalline or multi-crystalline. In addition, the amorphous/poly layer could contain substantial or even majority quantities of other materials including but not limited to Germanium (Ge), Carbon (C), Fluorine (F) etc. According to other implementations, the amorphous/poly material may be or include an amorphous/poly silicon layer that includes some Ge (to form SiGe) or C (to form SiC). The amorphous/poly material may be a silicon material that contains elements such as F (Fluorine), D (Deuterium), Hydrogen (H), Chlorine (Cl) etc., which may be useful in passivating the traps, grain boundaries, etc. in the crystallized silicon-containing film. The amorphous/poly material may also, in some implementations, include dopants such as B (Boron), Phorphorous (P), Arsenic (As) etc. incorporated in the film. In further implementations, the substrate or support layer (e.g., glass, etc.) can be replaced by other substrates such as plastics and/or metals. Overall, aspects of such innovations may lead to uniform grains, high carrier lifetime(s), and/or improved diffusion length(s) and mobilities.

Turning back to the laser anneal aspects, the amorphous/poly layer 103 may then be crystallized via heat application such as laser irradiation. In some exemplary implementations, such irradiation may be performed by a solid state laser with a wavelength between about 266 nm and about 2 µm. In certain exemplary implementations, the laser may be a solid state laser with a wavelength of about 515 nm or about 532 nm. The laser may be applied from the top of the substrate. However, in other implementations described elsewhere herein, the laser can also be applied from the bottom (through the substrate 101), i.e., when the substrate is mostly transparent to the laser wavelength used/selected. The choice of the laser being used from the top or through substrate may depend on the type of substrate being used as well as the types of materials used in and thicknesses of the anti-reflective coating and the amorphous/poly material(s).

As discussed herein, aspects of the innovations herein may include coating layers either on the outside of the substrate/glass layer, or in between the glass and the silicon layer, or in both places. Examples of such coating layers may include additional anti-reflective coating on the outside (light facing) side of the glass layer and/or a SiN or SiON or SiO2 layer or combination of these between the glass and silicon layer. In addition, still further aspects of the innovations herein may include other methods of crystallization, such as heat sources such as carbon strips or lamps which can be used to supply the heat needed for crystallization. Innovations herein are also applicable to other semiconductor materials such as SiGe (silicon-germanium) or SiC (silicon-carbide).

Figure 2:
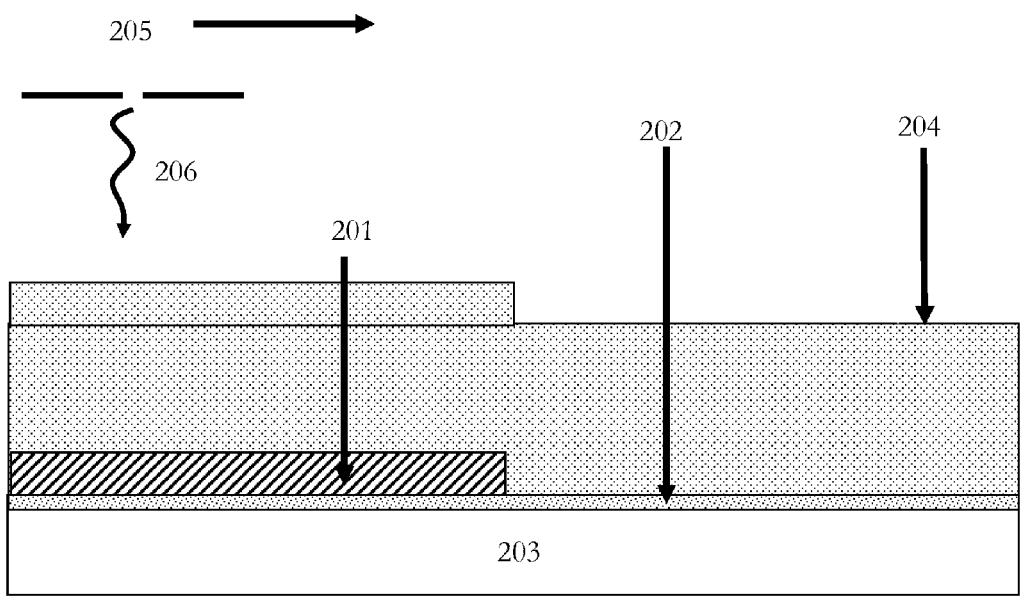
FIG. 2 illustrates a substrate having a seed layer beneath an amorphous/poly material layer, receiving laser irradiation from the top, consistent with aspects related to the innovations herein.

FIG. 2 illustrates a substrate 203 having a seed layer beneath an amorphous/polycrystalline material layer, receiving laser irradiation 206 from the top, consistent aspects related to the innovations herein. According to exemplary implementations of the innovations herein, the seed layer may be a silicon wafer or piece thereof. Further, consistent with some implementations, such piece of silicon wafer may applied with the desired thickness or it may be simultaneously or sequentially reduced in thickness by a suitable method such as cleaving, etching, polishing, etc., e.g., in one exemplary implementation, to a thickness of about 0.05 μm to about 100 μm. Here, such exemplary part of silicon wafer could be piece reduced in thickness by cleaving or thinning the wafer after bonding to leave only a thin layer on the glass. Additional details of substrates with seed layers, and related processing, may be found in U.S. patent application Ser. No. 12/842,996, filed Jul. 23, 2010, now U.S. patent application publication No. 20110089429, which are incorporated herein by reference in entirety. Referring to FIG. 2, a cross-section after deposition of an amorphous/poly layer 204 is depicted. The exemplary implementation of FIG. 2 shows the substrate 203 with an optional anti-reflective/stress relief layer 202 between the substrate 203 and the seed layer 201. In this implementation, the amorphous/poly layer 204 is deposited on top of the seed layer 201. Further, FIG. 2 also schematically shows laser irradiation 206, which may be scanned 205 across the sample to crystallize the amorphous/poly layer. Descriptions of the use of lasers to crystallize the amorphous/poly layer are set forth in more detail further below.

Figure 3:
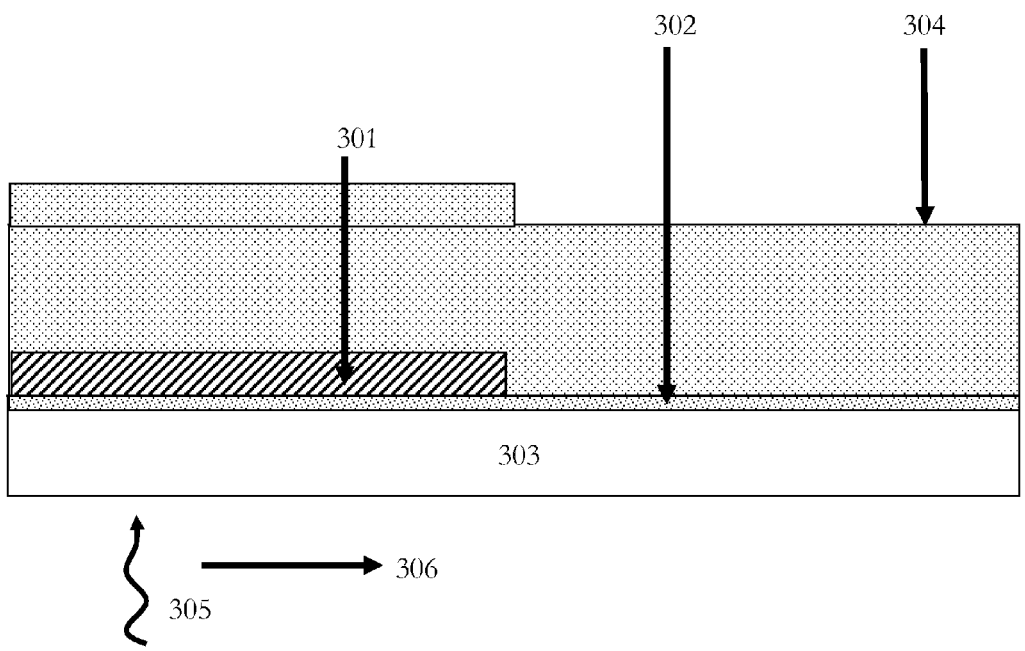
FIG. 3 illustrates a substrate having a seed layer beneath an amorphous/poly material layer, receiving laser irradiation from the bottom, consistent with aspects related to the innovations herein.

FIG. 3 illustrates a substrate 303 having a seed layer 301 beneath an amorphous/polycrystalline material layer 304, receiving laser irradiation 305 from the bottom, consistent aspects related to the innovations herein. The exemplary implementation of FIG. 3 shows the substrate 303 with an optional anti-reflective/stress relief layer 302 between the substrate 303 and the seed layer 301. In this implementation, the amorphous/poly layer 304 is also deposited on top of the seed layer 301. Further, FIG. 3 also schematically shows a laser 305, which may be scanned 306 across the sample to crystallize the amorphous/poly layer. Descriptions of the use of lasers, here, to crystallize the amorphous/poly layer are set forth in more detail further below.

Figure 4:
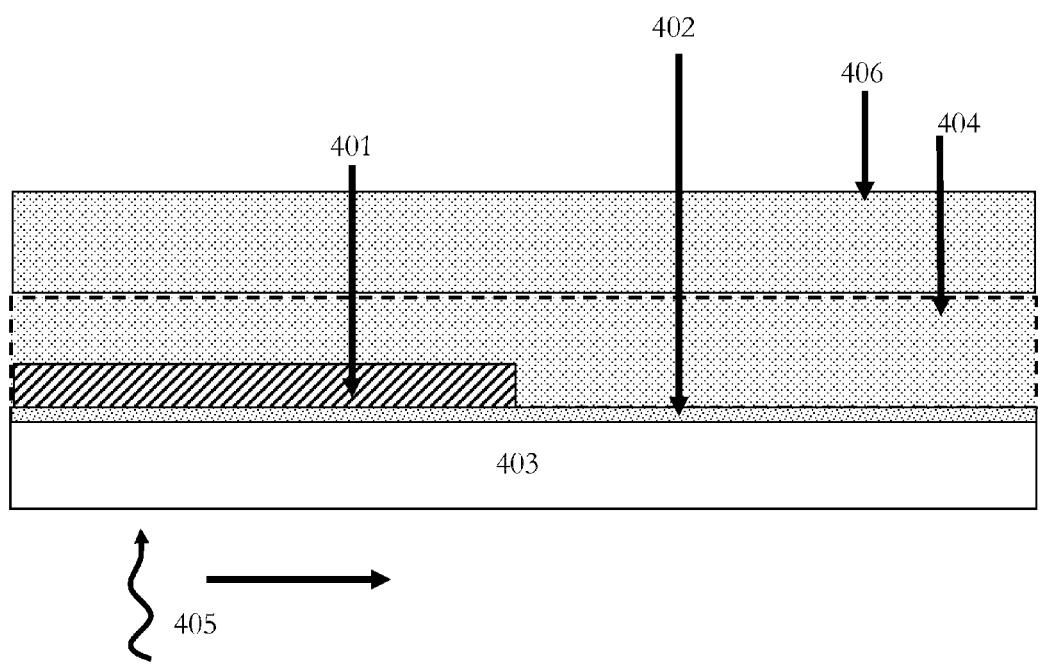
FIG. 4 illustrates a substrate having a seed layer beneath a first amorphous/poly material layer, as well as a second amorphous/poly layer on top of the first, and receiving laser irradiation from the bottom, consistent with aspects related to the innovations herein.

FIG. 4 illustrates a substrate 403 having a seed layer 401 beneath a first amorphous/poly material layer 404 as well as a layer of second amorphous/poly material 406 on top of the first, and receiving laser irradiation from the bottom 405, consistent aspects related to the innovations herein. Referring to the exemplary implementation of FIG. 4, the substrate 403 may be coated with an optional anti-reflective layer 402 and an amorphous/poly layer 404 such as a silicon layer or a silicon-containing layer. Further, the seed layer 401 may already be bonded on the anti-reflective layer 402 and crystallized with heat or laser. As further shown in FIG. 4, a second amorphous/poly layer 406, such as a silicon or silicon containing layer, may be deposited on top of the first amorphous/poly layer 404. The second amorphous/poly layer 406 may be amorphous silicon similar to the first amorphous layer 404. In some implementations, the second silicon containing layer 406 may be polysilicon or silicon-germanium (SiGe). In other words, the layer 406 and layer 404 may be the same composition or different compositions. In some exemplary implementations, a laser 405 may be used to crystallize the layer 406, in particular, via the sub-melt laser anneal processes herein. Further, in some implementations, it may be desirable to leave layer 406 partially or fully amorphous (non-crystallized) to take advantage of the better light absorption properties of amorphous silicon. Here, aspects of the innovations herein may relate to the creation of a layer of crystallized silicon on a substrate/glass using a 2-step process. In exemplary implementations, this silicon layer can be between about 0.05 μm and about 25 μm thick. Moreover, such thicknesses are substantially less than the 150 μm thick silicon wafers that are used to make the dominant solar cells in the marketplace.

Figure 5A:
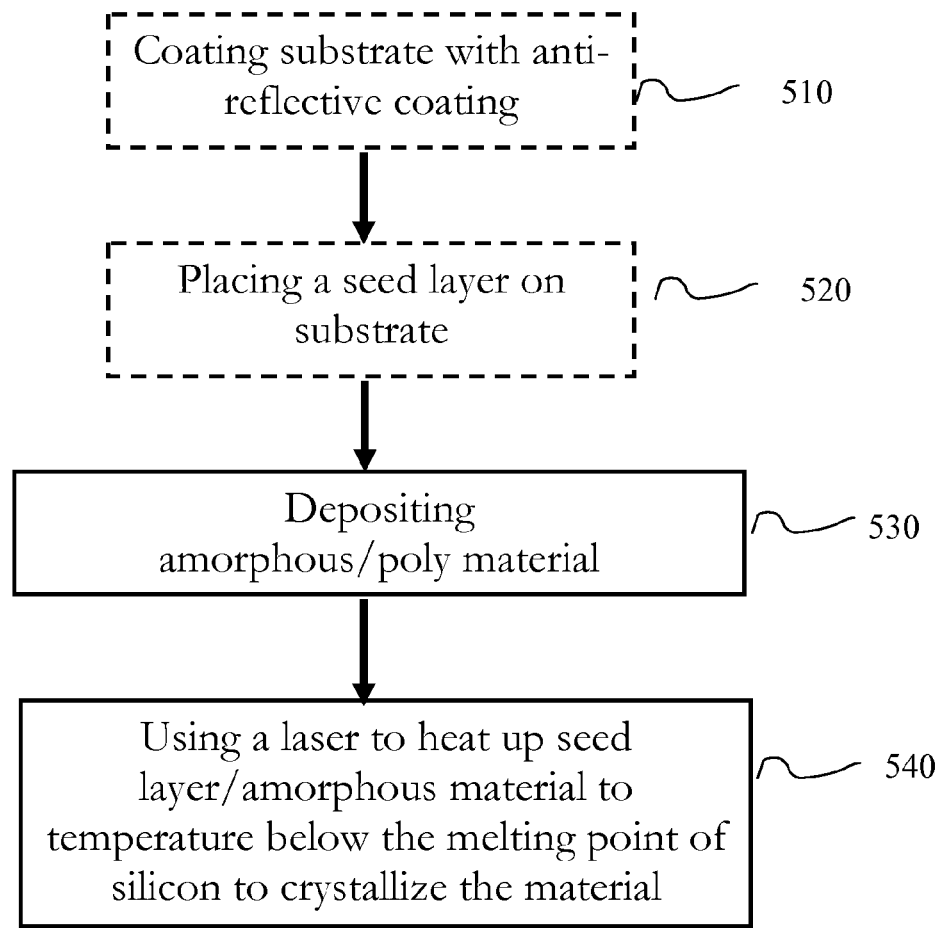
FIGS. 5A and 5B illustrate exemplary methods including crystallization of amorphous/poly materials on substrates, consistent with aspects related to the innovations herein.

FIG. 5A illustrates an exemplary method of crystallizing silicon/silicon-based materials on a substrate, consistent with aspects of the innovations herein. As shown in FIG. 5A, on optional step of placing a seed layer on a substrate, such as glass, may first be performed (step 520). This seed layer 1, which may be e.g. a crystalline silicon or crystalline silicon-containing seed, may be placed directly on top of the substrate, or it may be placed on top of another layer such as an anti-reflective coating, as shown in FIGS. 2-4 and explained in more detail elsewhere in this disclosure. Some exemplary details (e.g., placement/bonding, materials, etc.) of such seed layer(s) are set forth below in association with FIGS. 7A and 7B. Next, in step 530, the substrate (and optional seed layer) may be covered with an amorphous/poly material, such as amorphous/poly silicon or another amorphous/poly silicon-based material. Other amorphous/poly silicon containing materials include SiGe (silicon-germanium) or SiC (silicon carbide) or SiGeC (silicon-germanium-carbide). In certain implementations, a silicon containing amorphous/poly material may have intentional incorporation of deuterium or fluorine. Various exemplary deposition processes and layer characteristics are set forth in connection with FIGS. 7A and 7B and elsewhere herein. Moreover, in step 540, the amorphous/poly material (and, optionally, seed layer) may be heated via sub melt laser anneal to transform these materials into crystalline form, as set forth in more detail immediately below. Further, as an optional process, an initial step of coating the substrate with an anti-reflective coating (step 510) may be performed prior to the placement and heating of the amorphous/poly and seed materials on the substrate, as is set forth in more detail below in association with FIGS. 8A and 8B.

With regard to some innovative aspects of sub-melt laser anneal processes directed to crystallizing amorphous/poly silicon layer on glass or other non-silicon (metal, plastic, etc.) substrates, various parameters or conditions of the annealing processes may be controlled. Temperature of the amorphous/poly silicon layer, for example, may be maintained in a range of between about 1100° C. to about 1350° C., or between about 1150° C. to about 1200° C.

Moreover, innovations herein may also include a sub-melt laser anneal process that is specifically designed to melt only a portion of the amorphous/poly layer, leaving the remainder in solid form. For example, it has been found that desired properties of the device being fabricated may be achieved with only partial melt of the amorphous/poly layer. Accordingly, some exemplary implementations of the innovations herein comprise providing a sub-melt laser anneal that melts only a portion of an amorphous/poly layer. Further, the portion of the layer that is melted may be less than 50%. This may also be expressed as a melt-solid proportion, with exemplary implementations, here, having proportions of greater than about 10-90 up to about 50-50. According to some exemplary implementations in this regard, certain materials may require particular laser treatments and repetition rates to achieve sub-melt crystallization while maintaining the layer in any such desired ratios of melt-solid proportion. For example, in the context of amorphous silicon layers, gas laser and excimer lasers, given their limitations on repetition rates (such as low repetition rates, e.g., less than 10 kHz), are unable to maintain these melt-solid proportions in the context of sub-melt crystallization. Accordingly, aspects of innovations involving such melt-solid proportions include application of solid state lasers to achieve desired sub-melt crystallization of amorphous silicon layers. In exemplary implementations, these solid state lasers may be used with high repetition rates of greater than 10 KHz.

Figure 5B:
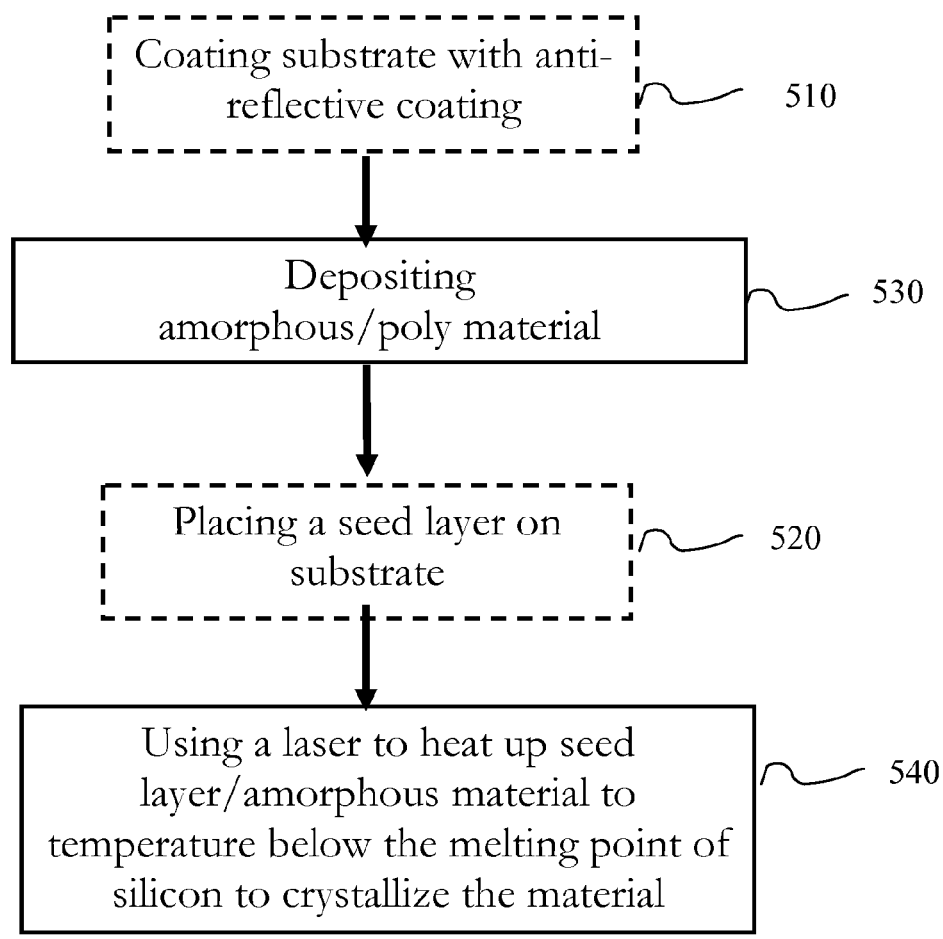

FIG. 5B illustrates an exemplary method of crystallizing silicon/silicon-based materials on a substrate, consistent with aspects of the innovations herein. FIG. 5B illustrates an alternate implementation of the innovations herein involving similar steps of FIG. 5A, although with the order of placing the amorphous/poly material and seed layer on the substrate reversed. In other words, in FIG. 5B, the substrate is first covered, in step 530, with the amorphous/poly material. Then, in step 520, an optional step of placing a seed layer or seed material on top of the amorphous/poly material may be performed. The processes and materials used, here, may be similar to those set forth in connection with FIG. 5A above. Lastly, once the amorphous/poly material and seed layer are in place, a step of providing a sub-melt laser anneal to the layer (step 540) using techniques consistent with those set forth herein is performed. In some implementations of the techniques shown in FIG. 5A and/or FIG. 5B, the laser source may be through the glass. In other implementations, the laser source may be directly incident on the material and seed from the top.

Figure 6:
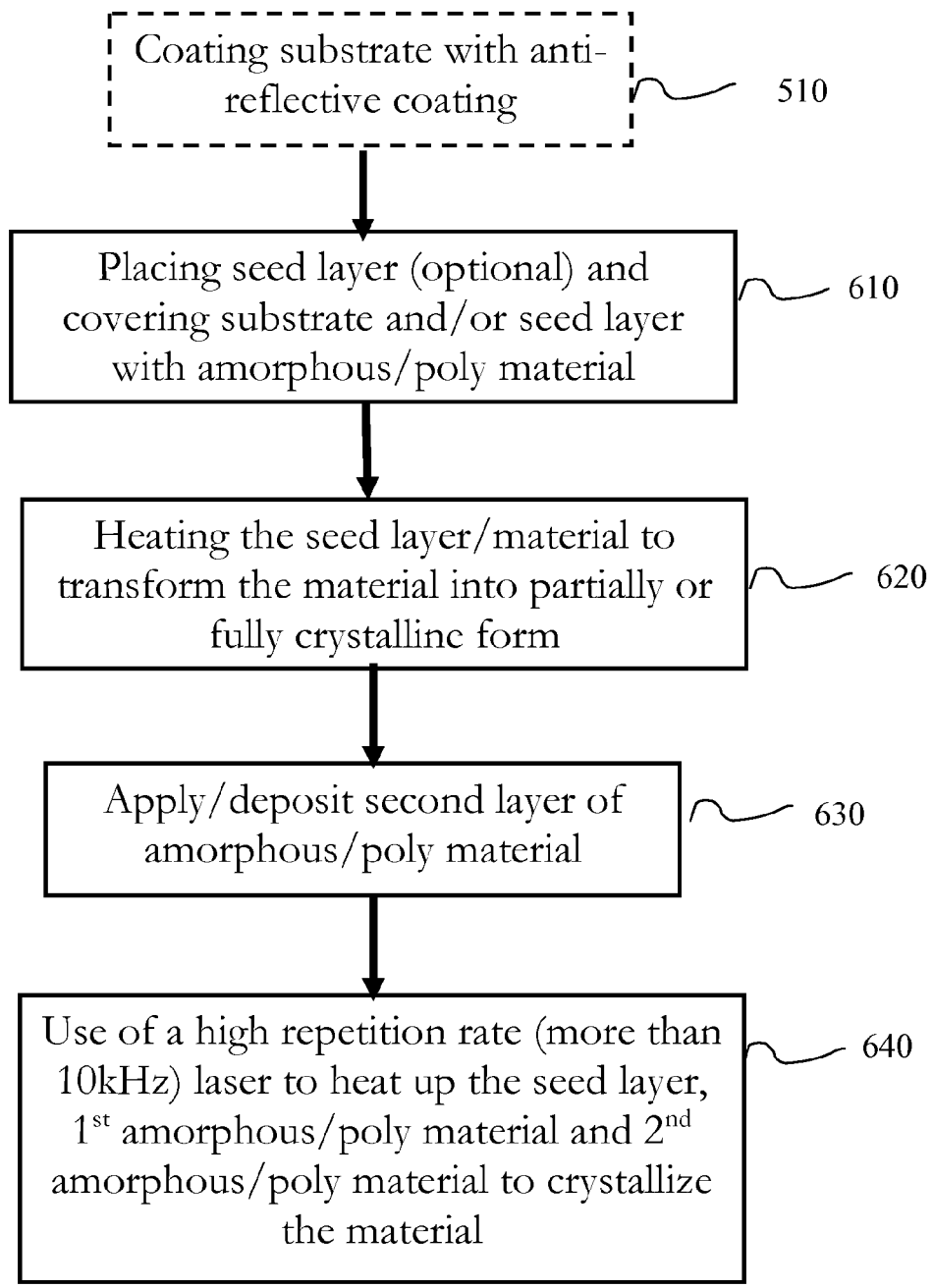
FIG. 6 illustrates another exemplary method including crystallization of amorphous/poly materials on substrates, consistent with aspects related to the innovations herein.

FIG. 6 illustrates another exemplary method of crystallizing silicon/silicon-based materials on a substrate, consistent with aspects of the innovations herein. Referring to FIG. 6, an initial step of applying an amorphous/poly layer and optionally a seed layer is/are performed (step 610). Here, for example, the seed layer may be applied first with the amorphous/poly material on top as explained in connection with FIGS. 5A, 7A, etc., or the amorphous/poly material may be applied first as explained in connection with FIGS. 5B, 7B. Moreover, use of a seed layer may be omitted entirely. Next, a step of heating the seed layer and the amorphous/poly material (step 620) is performed, until the material is transformed into partially or fully crystalline form. Here, for example, this heating step may comprise any of the heating and/or laser application techniques set forth herein. Another step of applying a second layer of amorphous/poly material is then performed (step 630). Here, according to one or more exemplary implementations, a second amorphous/poly layer, such as a layer of amorphous silicon, having a thickness of about 300 nm to about 30 μm may be deposited. Further, prior to deposition of the second amorphous/poly layer, an optional soft etch may be performed, as set forth in more detail below in connection with FIG. 9. Finally, a sub-melt laser anneal step may then be performed (step 640) to achieve further crystallization after deposition of this second amorphous/ploy layer. Details of some exemplary implementations of such sub-melt laser anneal processes are set forth immediately below. Finally, as an optional process, an preliminary step of coating the substrate with an anti-reflective coating (step 510) may be performed prior to the placement and heating of the silicon materials on the substrate, as set forth in more detail above in association with FIGS. 8A and 8B.

According to one or more implementations herein, exemplary sub-melt laser anneal processes may be achieved via application of pulsed lasers with high repetition rates (e.g., >10 kHz, etc.), to provide for solid phase crystallization in the amorphous/poly layer. Further, exemplary laser with wavelengths in about the green wavelength (e.g., 532 nm, etc.) as well as those with wavelengths in about the infrared wavelength (e.g., 1.06 μm, etc.) may be used consistent with the innovations herein. Turning back to some exemplary repetition rates for such lasers, sub-melt laser anneal consistent with the innovations herein may be performed at a repetition rate of between about 10 kHz to about 100 MHz, or between about 100 kHz to about 80 MHz, or between 1 MHz to about 50 MHz.

According to further implementations, methods, products and devices consistent with the innovations herein may involve use of laser anneal parameters, such as scan speed and pulse energy, that are determined as a function of laser wavelength and/or amorphous/poly film thickness. For example, in implementations wherein anneal is provided via a 532 nm laser on an amorphous/poly film of about 20 nm to about 300 nm, a scan speed of about 5 mm/sec to about 70 mm/sec may be utilized. Furthermore, here, scan speed of about 10 mm/sec to about 40 mm/sec, or a speed of about 15 mm/sec, may be used. With regard to additional laser parameters applicable to use of a 532 nm laser, lasers with laser line sources of about 10 mm to about 500 mm in the long axis and about 3 μm to about 100 μm in the short axis may be used; here, for example, line sources of about 80 mm or about 20 mm in the long axis may be used, and line sources of about 5 μm, or of about 20 μm in the short axis may be used. Additionally, innovations herein also include the use of 'flat top' line source, i.e., wherein the intensity is constant along the long axis. Lastly, along the short axis, the line source may have a flat or Gaussian profile.

While some specific exemplary ranges and materials are described herein, it should also be understood that changes in parameters such as laser wavelength, film thickness, etc., will entail corresponding changes in the power, scan speeds, pulse energies and other energy- and melt-temperature-dependent parameters required to achieve the sub-melt laser anneal set forth herein. For example, lasers having a wavelength of 1.06 μm entail anneal processes of differing parameters and may also entail use on amorphous/poly layers having different characteristics (e.g., thicknesses, etc.). According to some exemplary implementations, lasers of 1.06 μm wavelength may be used to crystallize or partially crystallize amorphous/poly materials of thicknesses in the range of about 300 nm to about 30 μm, or between about 500 nm and about 5 μm, or between about 1 μm and about 4 μm. Further such laser may be a line source or spot source. With regard to line source lasers, a laser having a line source of about 50 mm by about 50 μm may be used. With regard to spot lasers, a laser having a spot size of about 30 μm to about 1000 μm may be used, or having a spot size of about 250 μm. Here, in such exemplary implementations, the spot may be rastered across the substrate at a rate of between about 1 cm2/sec to about 100 cm2/sec, at a rate of between about 5 cm2/sec to about 20 cm2/sec, or at a rate of about 10 cm2/sec. Moreover, with regard to pulsed laser implementations, such lasers may also be utilized at a repetition rate of about 1 MHz to about 50 MHz. Lastly, non-pulsed or CW (continuous wave) application of such lasers may also be utilized in some implementations. Here, for example, CW lasers with wavelengths below 1.6 microns may be used, to provide for the anneal innovations herein without damage to the substrate.

Figure 7A:
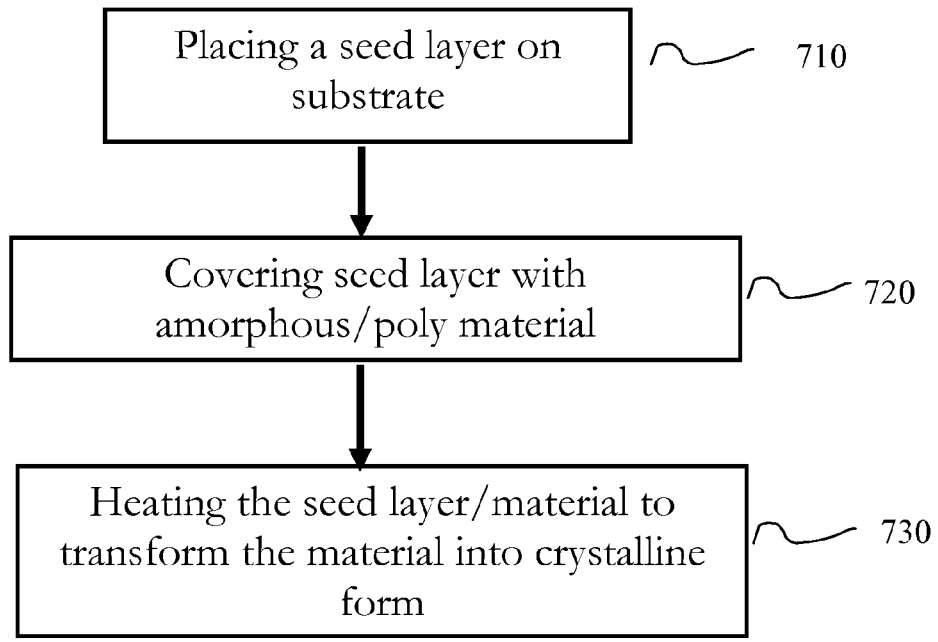
FIGS. 7A and 7B illustrate exemplary methods including crystallization of amorphous/poly materials on substrates, consistent with aspects related to the innovations herein.

FIG. 7A illustrates an exemplary method of crystallizing silicon/silicon-based materials on a substrate, consistent with aspects of the innovations herein. As shown in FIG. 7A, a silicon-containing seed layer may be placed on a substrate, such as glass (step 710). This crystalline silicon-containing seed layer 1 may be placed on top of the substrate, as shown in FIG. 1, or it may be placed on top of another layer such as an anti-reflective coating, as explained in more detail below. Here, the seed layer may also be bonded to the substrate or other layer by means of electrostatic bonding. The seed layer may also be placed by by mechanical means, such as vacuum. In other implementations, either hydrophilic or hydrophobic bonding may be used. In some implementations, bonding using a laser or other heat source may be used. In some exemplary implementations, the seed layer may be about 50 nm to about 100 micrometers, in other exemplary implementations about 200 nm to about 600 nm, and in still other exemplary implementation, about 350 or about 355 nm. Next, in step 720, the seed layer may be covered with an amorphous/poly material, such as amorphous/poly silicon or another amorphous/poly silicon-based material. Other amorphous/poly silicon containing materials include SiGe (silicon-germanium) or SiC (silicon carbide) or SiGeC (silicon-germanium-carbide). In some implementations, the silicon containing amorphous/poly material may have intentional incorporation of deuterium or fluorine. In some exemplary implementations, the amorphous/poly material may be deposited via depositions processes such as CVD or PECVD (plasma enhanced chemical vapor deposition), via sputtering processes, or other known processes of depositing such layer(s). Here, for example, an amorphous/poly layer having a thickness of about 20 nm to about 1000 nm may be deposited over the seed layer. In further exemplary implementations, a layer of about 30 nm to about 60 nm may be deposited on the seed layer, and in still further exemplary implementations, a layer of about 45 nm may be deposited. Additionally, in step 730, the seed layer and amorphous/poly material may be heated to transform these materials into crystalline form. Here, for example, these materials may be heated by conventional heating mechanisms used, such as strip heaters or lamps, and/or they may be heated via lasers to crystallize the material, such as via the sub-melt laser anneal processes set forth above or the laser crystallization processes set forth below. In some implementations using lamps, the lamps may be configured in the form of a line source focused on the material. In some exemplary implementations, a laser of wavelength between about 266 nm and about 2 micrometers may be applied to the materials to transform them into crystalline form. In other exemplary implementations, lasers of wavelengths from about 400 nm to about 700 nm may be used, lasers of green wavelength may be used, lasers of ultraviolet wavelength may be used, and/or in still further exemplary implementations, a laser having a wavelength of about 532 nm or about 515 nm may be used.

In general, the laser anneal processes herein may be optimized to grow the crystal vertically on top of the seed layer, and may also be applied to grow the crystal laterally on the side of the seed layer. According to exemplary implementations of the present innovations, the lasers used herein may utilize different settings such as power, pulse energy, scan speed, and spot size (e.g., on top of the seed layer, etc.), and/or different settings or even different lasers when being irradiated on the sides of the seed layers.

Figure 7B:
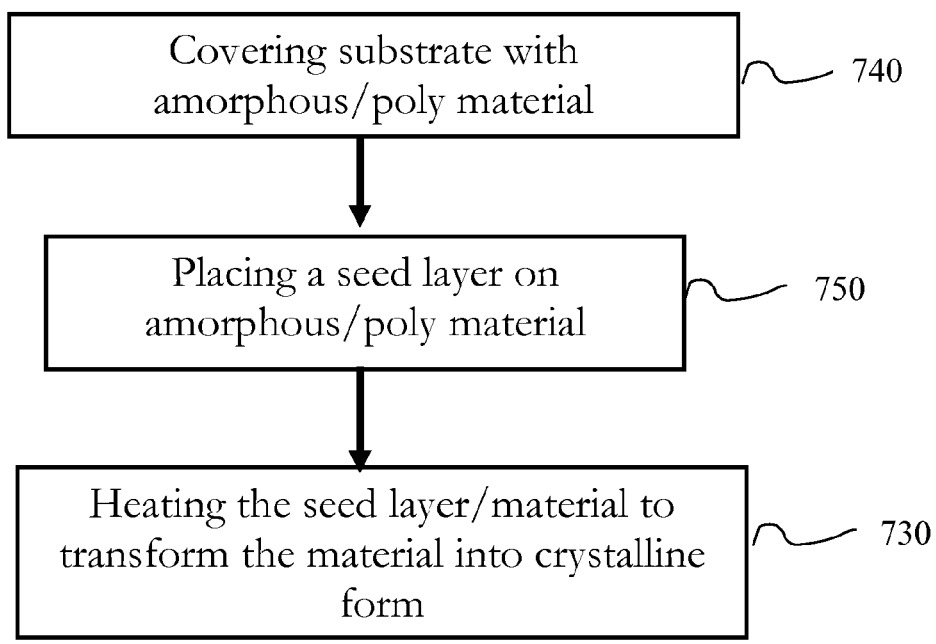

FIG. 7B illustrates an exemplary method of crystallizing silicon/silicon-based materials on a substrate, consistent with aspects of the innovations herein. FIG. 7B illustrates an alternate implementation of the innovations herein involving similar steps of FIG. 7A, although with the order of placing the amorphous/poly material and seed layer on the substrate reversed. In other words, in FIG. 7B, the substrate is first covered, in step 740 with the amorphous/poly material. Then, in step 750, a silicon-containing seed layer or material is placed on top of the amorphous/poly material. The processes and materials used, here, may be similar to those set forth in connection with FIG. 7A above. Lastly, once the amorphous/poly material and seed layer are in place, these materials are heated (step 730) using techniques consistent with those set forth above in connection with FIG. 7A. In some implementations of the techniques shown in FIG. 7A or FIG. 7B, the laser source may be through the glass. In other implementations, the laser source may be directly incident on the material and seed from the top.

Figure 8A:
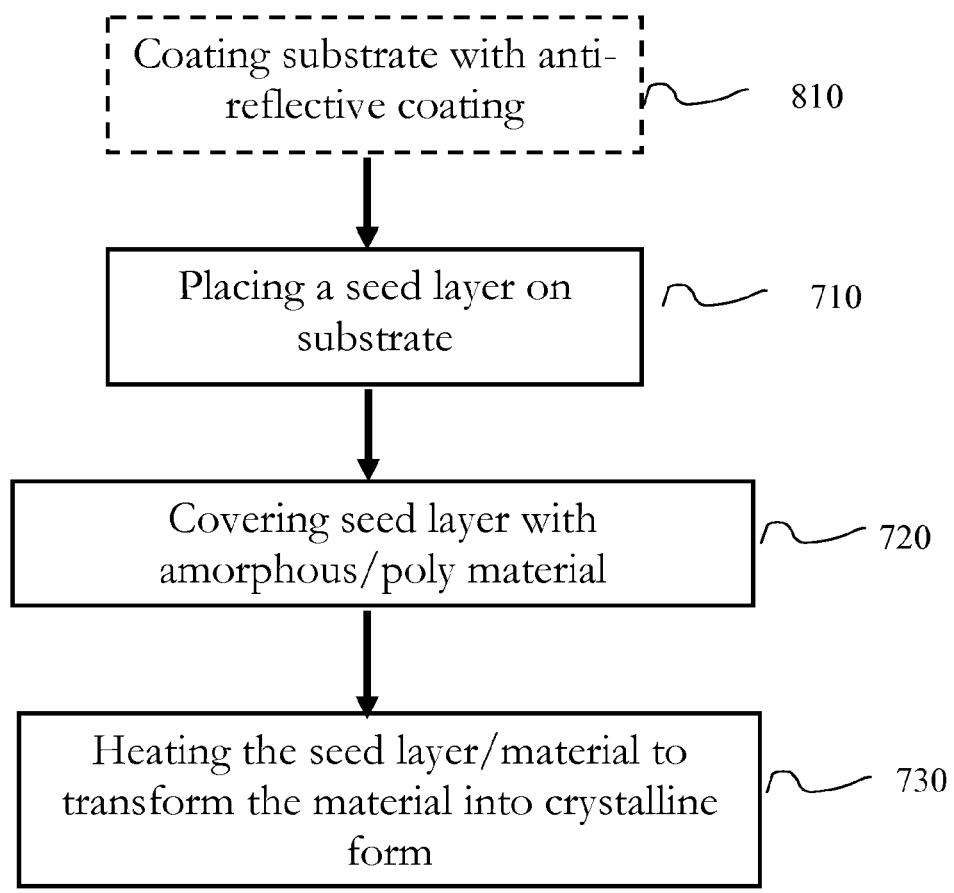
FIGS. 8A and 8B illustrate exemplary methods including crystallization of amorphous/poly materials on substrates including a coating step, consistent with aspects related to the innovations herein.

FIG. 8A illustrates another exemplary implementation of the innovations of FIG. 7A although including a step of initially coating the substrate with an anti-reflective coating (step 810) prior to placement of the seed and amorphous/poly material layers thereon. Here, for example, a silicon based antireflective layer such as SiN, $SiO_2$, SiON, etc., may be first deposited on the substrate, prior to placement and processing of the remaining layers. In some exemplary implementations, a SiN, $SiO_2$ or SiON coating having a thickness of about 50 nm to about 250 nm may be deposited. In other exemplary implementations, such a coating of about 65 nm to about 95 nm in thickness may be used, and in still a further exemplary implementation, a coating of about 75 nm in thickness may be used. The anti-reflective coating layer may also be composed of more than one material, such as, for example a SiN layer applied in connection with an SiO2 layer. According to one exemplary implementation, the SiN layer may be of about 75 nm thick and the SiO2 layer may be about 20 nm thick. Further, a layer of this nature, such as a SiO2 layer, may serve as a stress-relief layer. In alternate implementations, such materials of thickness in a range of about 120 nm to about 180 nm, or of about 150 nm, may be used, such as with SiN layers. Consistent with other aspects of the innovations herein, SiO2 layers having thickness in ranges between about 0 (little or no layer) through about 200 nm, between about 10 nm to about 30 nm, or of about 20 nm may be used. Next, the steps of placing a silicon-containing seed layer on the substrate (710), covering the seed layer with amorphous/poly material (720), and heating the seed layer/material to transform the material into crystalline form (730), as with FIG. 7A, may be performed on top of the anti-reflective coating.

Figure 8B:
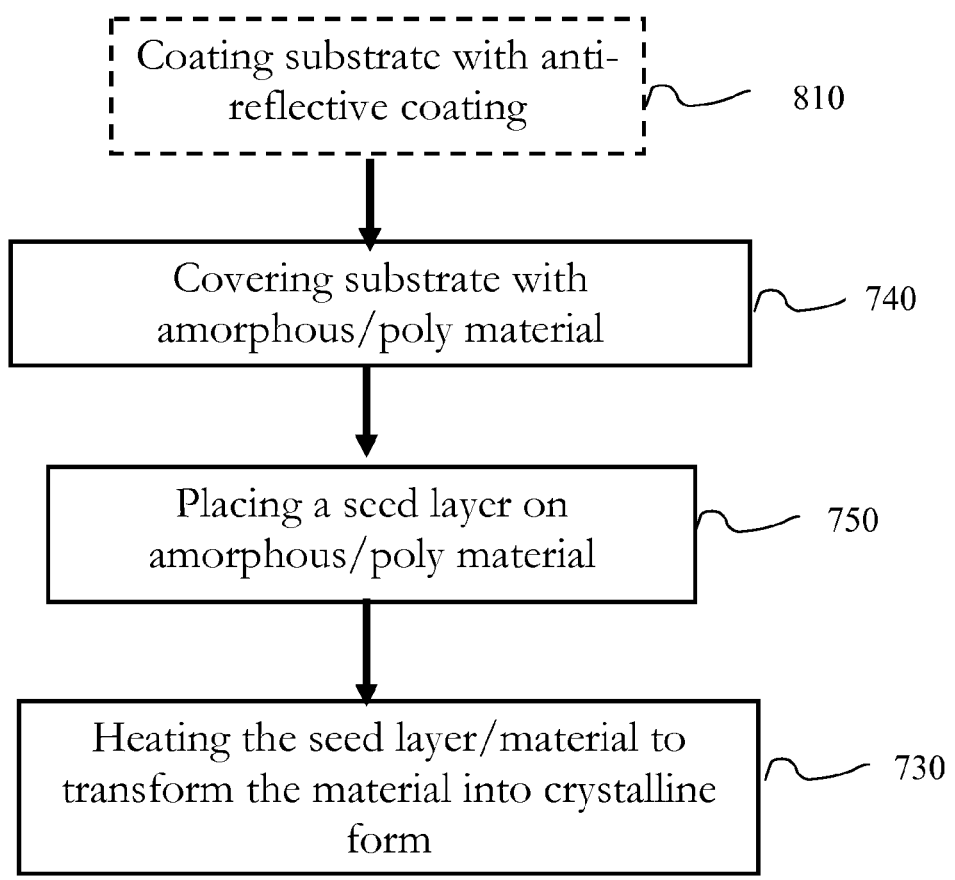

FIG. 8B illustrates another exemplary implementation of the innovations of FIG. 7B although including a step of initially coating the substrate with an anti-reflective coating (step 810) prior to placement of the amorphous/poly material and seed layers thereon. Anti-reflective coatings consistent with those set forth above in connection with FIG. 8A may be used. Further, after the anti-reflective coating is applied, the steps of covering with amorphous/poly material (740), placing a silicon-containing seed layer on the amorphous/poly material (750), and heating the seed layer/material to transform the material into crystalline form (730) may be performed on top of the anti-reflective coating.

Figure 9:
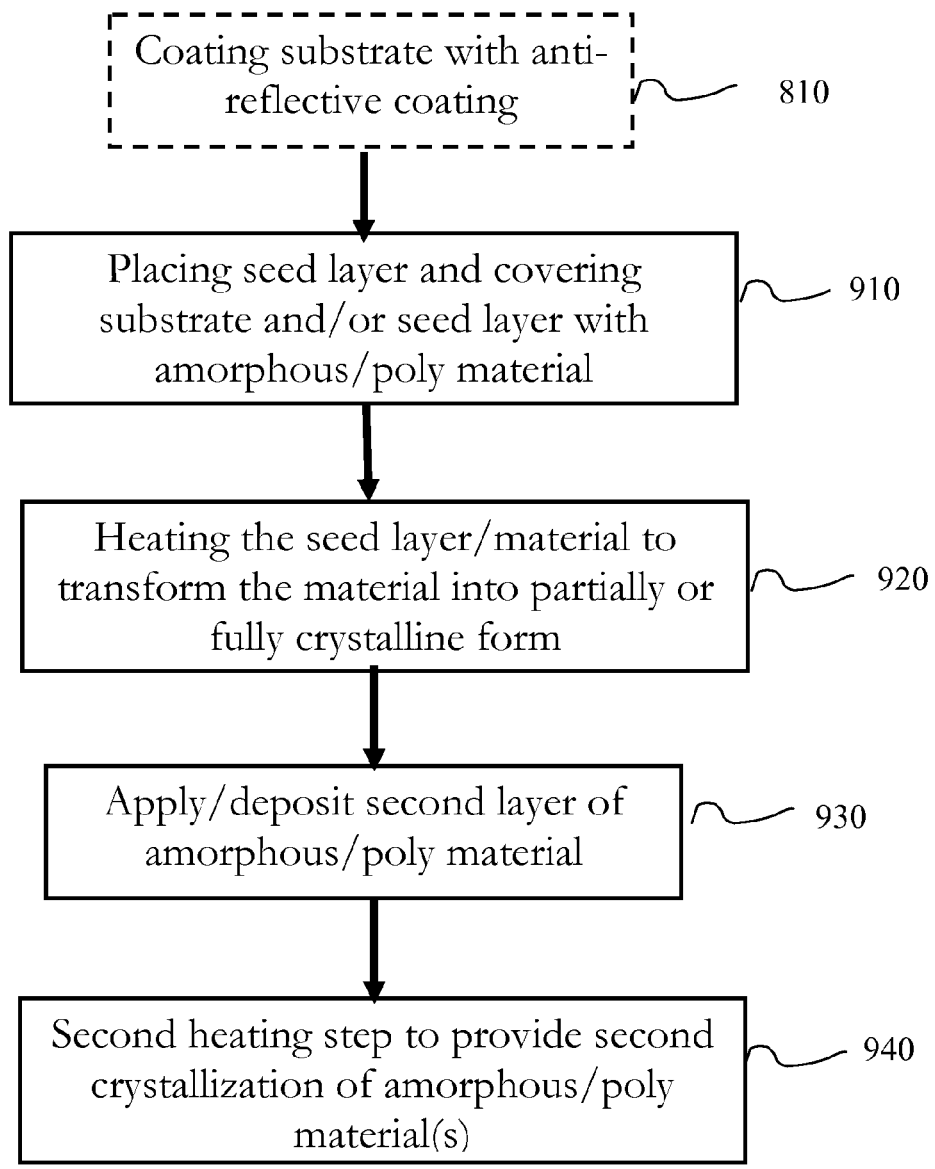
FIG. 9 illustrates another exemplary method including crystallization of amorphous/poly materials on a substrate, consistent with aspects related to the innovations herein.

FIG. 9 illustrates another exemplary method of crystallizing silicon/silicon-based materials on a substrate, consistent with aspects of the innovations herein. Referring to FIG. 9, an initial step of applying seed and amorphous/poly layers is performed (step 910). Here, for example, the seed layer may be applied first with the amorphous/poly material on top as explained in connection with FIG. 7A, or the amorphous/poly material may be applied first as explained in connection with FIG. 7B. Next, a step of heating the seed layer and the amorphous/poly material (step 920) is performed, until the material is transformed into partially or fully crystalline form. Here, for example, this heating step may comprise any of the heating and/or laser application techniques set forth herein. Another step of applying a second layer of amorphous/poly material is then performed (step 930). Here, according to one or more exemplary implementations, a second amorphous/poly layer, such as a layer of amorphous silicon, having a thickness of about 50 nm to about 30 μm may be deposited. For example, a second amorphous/poly layer of between about 1 μm to about 8 μm may be deposited. According to some exemplary implementations, a second amorphous/poly layer of about 4 μm may be deposited. Further, prior to deposition of the second amorphous/poly layer, an optional soft etch may be performed. The soft etch may be used to remove any native oxide on top of the first amorphous/poly layer. In addition, the soft etch may be tailored to roughen the surface of the first amorphous/poly layer to improve the adhesion of the second amorphous/poly layer. Finally, another step of heating may then be performed (step 940) to achieve further crystallization after deposition of this second amorphous/ploy layer. Again, such crystallization may be achieved via any of the heating and/or laser application processes set forth herein. According to one or more exemplary implementations, here, this material may be heated via a laser having a wavelength between about 266 nm and about 2 µm. Further, in some implementations, the laser may be within or near to the infrared wavelengths, the laser may have a wavelength between about 800 nm and about 1600 nm, have a wavelength of about 880 nm, or have a wavelength of about 1.06 µm. Further, as an optional process, an initial step of coating the substrate with an anti-reflective coating (step 810) may be performed prior to the placement and heating of the silicon materials on the substrate, as set forth in more detail above in association with FIGS. 8A and 8B.

Figure 10:
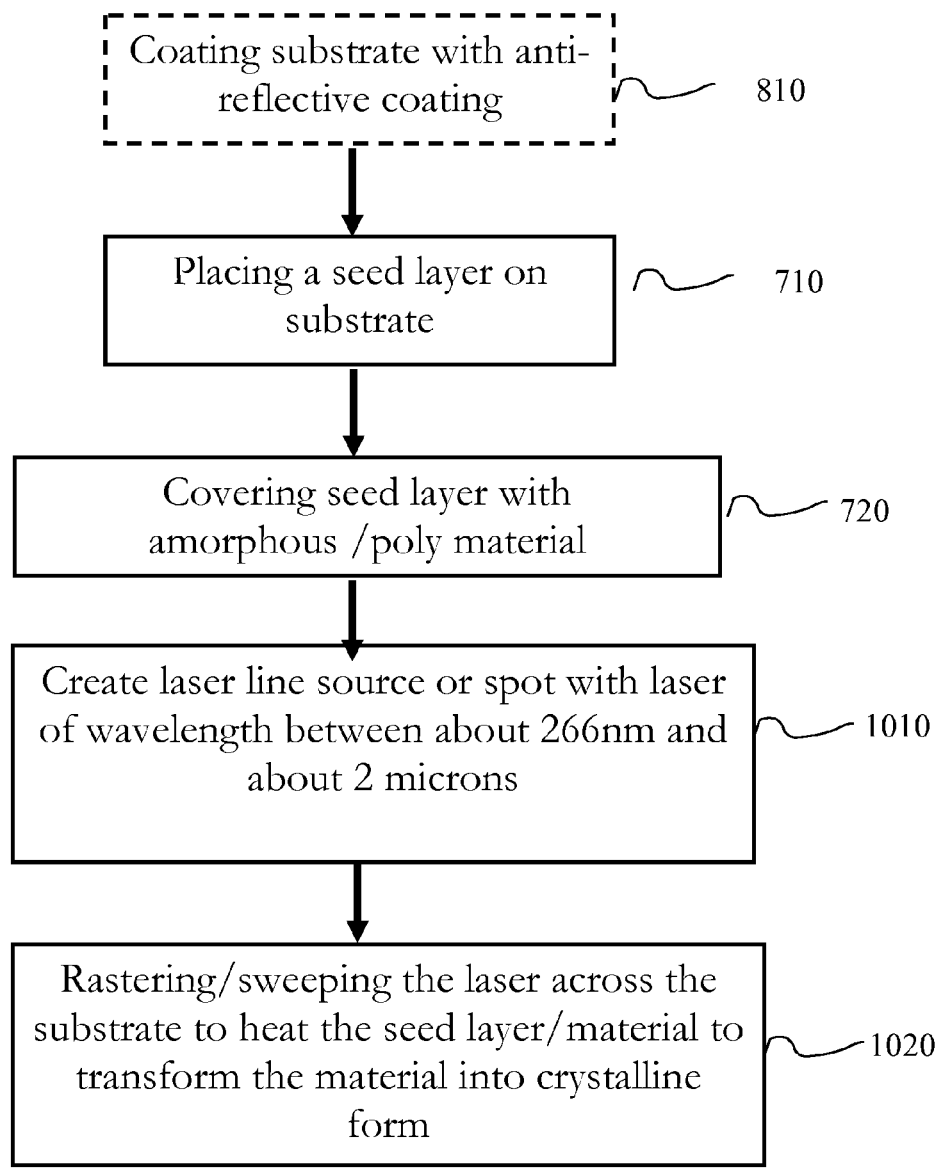
FIGS. 10-14 illustrate further exemplary methods including crystallization of amorphous/poly materials on substrate(s), consistent with aspects related to the innovations herein.

FIG. 10 illustrates a further exemplary method of crystallizing silicon/silicon-based materials on substrate(s), consistent with aspects of the innovations herein. FIG. 10 illustrates an exemplary method of crystallization comprising initial steps (steps 710 and 720) related to placement of materials on a substrate as well as heating steps (steps 1010 and 1020) related to crystallizing the materials upon a substrate. This exemplary method begins with steps of placing a silicon-containing seed layer on substrate 710, and covering the seed layer with amorphous/poly material 720, as set forth in more detail in connection with FIGS. 7A and 7B, above. These steps (steps 710 and 720) may also be done in the reverse order, as explained above in connection with FIGS. 8A and 8B. With regard to the exemplary heating/crystallization steps, here, a step of creating a laser line or spot source with a laser of a wavelength between about 266 nm and about 2 µm (step 1010) may be performed. Here, the laser may be focused on the seed/material from above, or through the substrate (if mostly transparent to the wavelength chosen). Next, one or more steps of rastering and/or sweeping the laser across the substrate (step 1020) are performed. In some exemplary implementations, the laser may first be focused on/over the seed layer and then swept across the substrate to crystallize the deposited material. Here, such rastering or sweeping may be performed in 2 or more steps and/or directions. For example, the laser may be applied using one or more X-direction scans and/or one or more Y-direction scans, whereby the seed layer/amorphous-poly material is heated to transform it into crystalline form. Further, as an optional process, an initial step of coating the substrate with an anti-reflective coating (step 810) may be performed prior to the placement and heating of the silicon materials on the substrate, as set forth in more detail above in association with FIGS. 8A and 8B.

Figure 11:
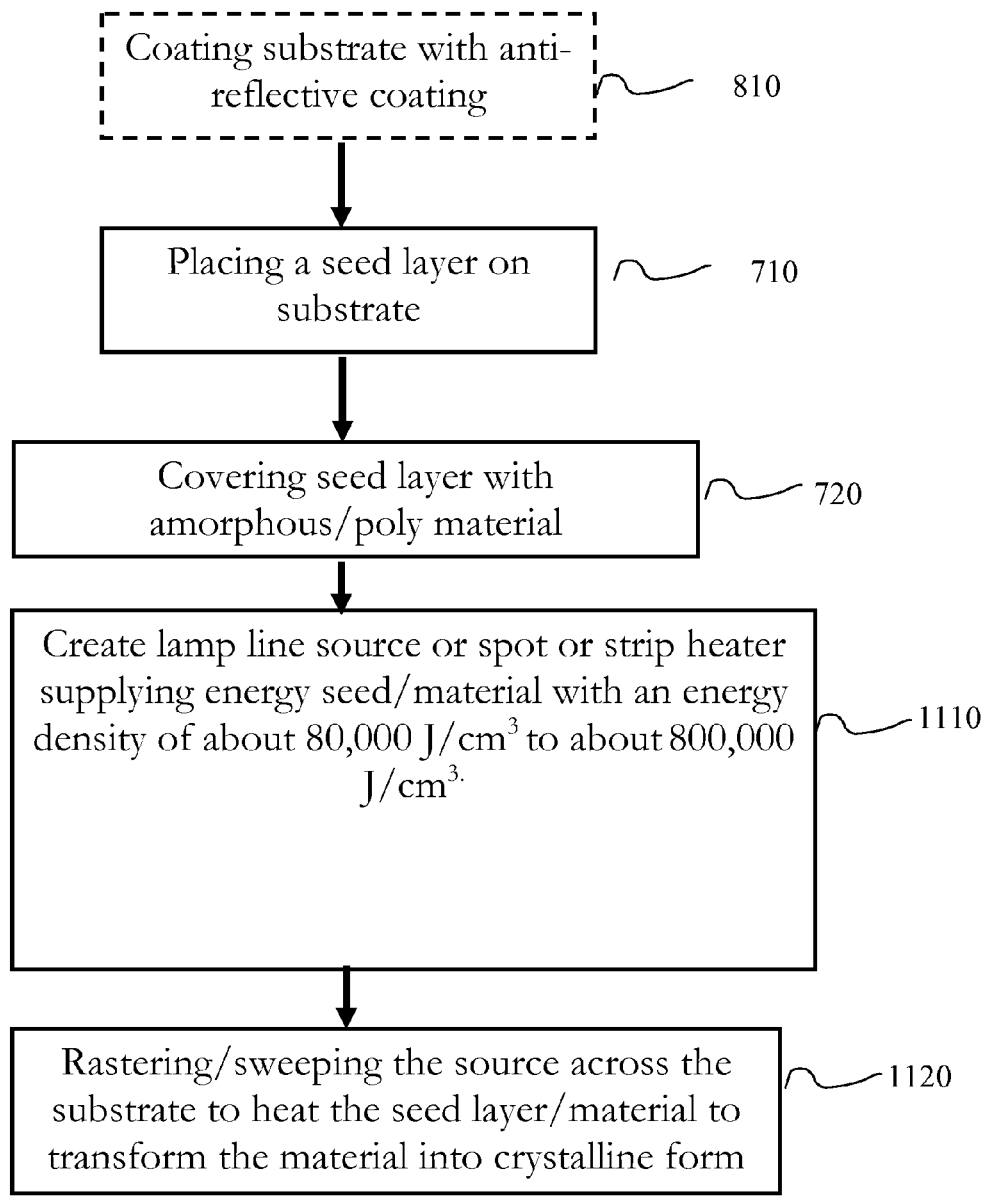

FIG. 11 illustrates yet another exemplary method of crystallizing silicon/silicon-based materials on substrate(s), consistent with aspects of the innovations herein. FIG. 11 illustrates an exemplary method of crystallization comprising initial steps (steps 710 and 720) related to placement of materials on a substrate as well as heating steps (steps 1110 and 1120) related to crystallizing the materials upon a substrate. This exemplary method begins with steps of placing a silicon-containing seed layer on substrate 710, and covering the seed layer with amorphous/poly material 720, as set forth in more detail in connection with FIGS. 7A and 7B, above. These steps (steps 710 and 720) may also be done in the reverse order, as explained above in connection with FIGS. 8A and 8B. With regard to the exemplary heating/crystallization steps, here, a step of applying energy (step 1110) such as heat energy to the seed layer/amorphous-poly material is then performed. Such energy may be applied by a lamp line source, one or more spot heaters, one or more strip heaters, other known heating devices used in semiconductor, thin film or flat panel processing, and/or via any of the laser applications set forth herein. In some exemplary implementations, here, energy such as heat energy having energy densities between about 80,000 J/cm$^3$ to about 800,000 J/cm$^3$, or between about 200,000 J/cm$^3$ to about 550,000 J/cm$^3$, or between about 400,000 J/cm$^3$ to about 450,000 J/cm$^3$ may be applied with regard to silicon layers, here. According to other implementations, energies of specific quantities may be applied as a function of the melting point, composition, physics, and/or thickness of the amorphous/poly material. By way of example, here, for amorphous silicon, energy of between about 400 mJ/cm$^2$ and about 4000 mJ/cm$^2$ for a silicon material thickness of about 50 nm may be applied. Moreover, absent other parameter changes, materials other than such pure silicon will require correspondingly commensurate levels of energy to achieve crystallization as a function of their physics, physical response to the energy being applied, and melting point. According to some exemplary implementations using a lamp or strip heater, the heat source is stepped and repeated, i.e., one area of the amorphous/poly material is heated and then either the heat source or the substrate is moved/stepped so the heat source is applied to the next area, and so on. In this fashion the amorphous/poly material on the entire area of the substrate may be crystallized. Next, for processes in which such energy is being applied via a movable source, one or more steps of rastering and/or sweeping the source across the substrate (step 1120) are performed. In some exemplary implementations, the laser may first be focused on/over the seed layer and then swept across the substrate to crystallize the deposited material. Here, such rastering or sweeping may be performed in 2 or more steps and/or directions. For example, the laser may be applied using one or more X-direction scans and/or one or more Y-direction scans, whereby the seed layer/amorphous-poly material is heated to transform it into crystalline form. Further, as an optional process, an initial step of coating the substrate with an anti-reflective coating (step 810) may be performed prior to the placement and heating of the silicon materials on the substrate, as set forth in more detail above in association with FIGS. 8A and 8B.

Figure 12:
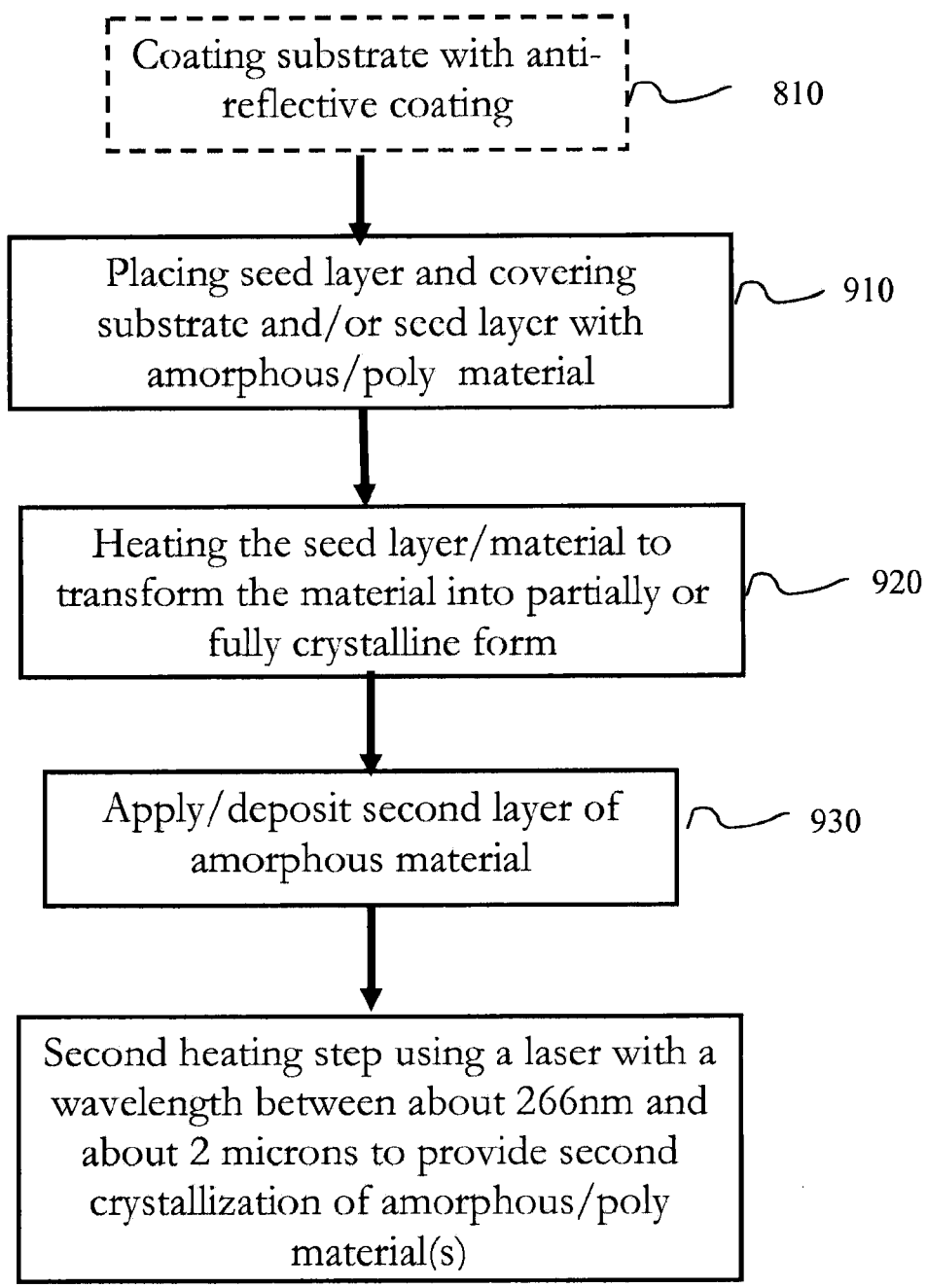
Figure 13:
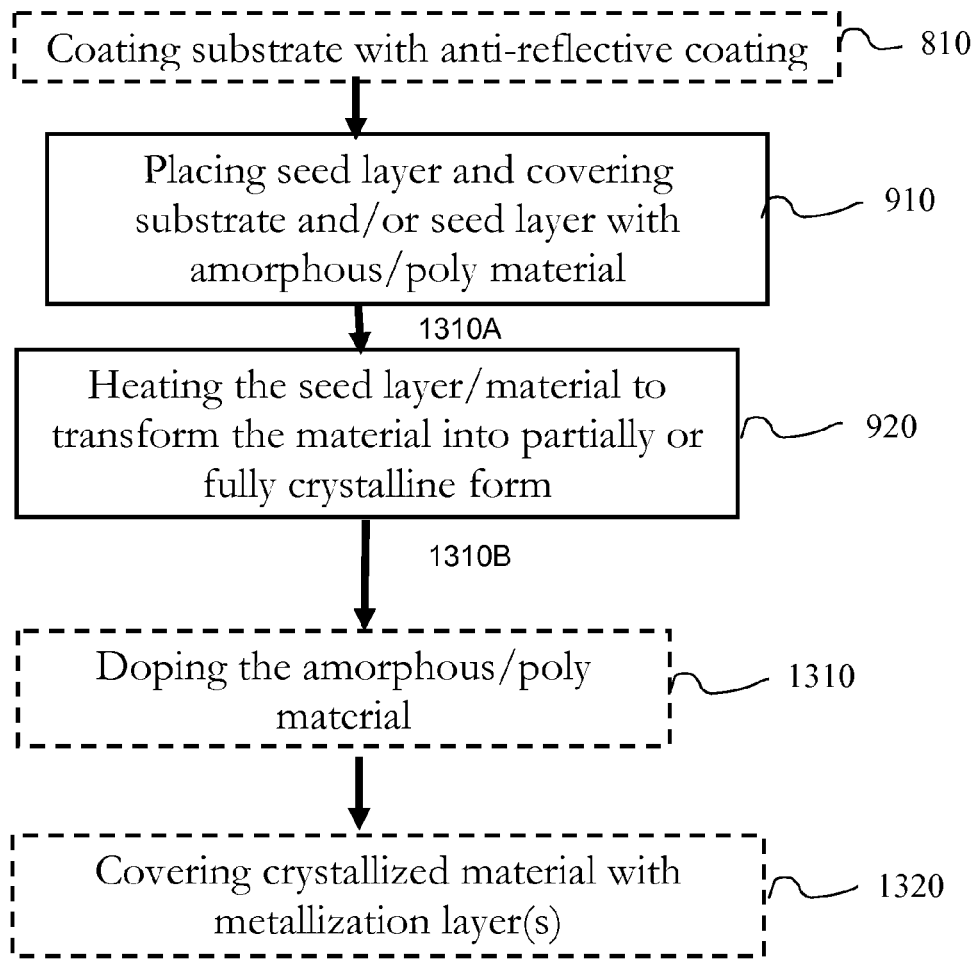

Referring to FIG. 12, another exemplary method of crystallizing amorphous/poly materials on substrate(s), consistent with aspects of the innovations herein, is shown. FIG. 13 illustrates an initial series of steps, steps 910, 920 and 930, consistent with FIG. 9. Specifically, initial steps of placing the seed layer and amorphous/poly material on the substrate 910 (in any order), heating the seed layer/amorphous-poly material 920 into crystalline or partially crystalline form, and covering the crystallized material with a second layer of amorphous/poly material 930 may be performed. Next, in the exemplary implementation illustrated, this second layer of amorphous/poly material may be heated via a laser having a wavelength between about 266 nm and about 2 µm, wherein such lasers may be applied from above the substrate, or from below the substrate (for substrates that are mostly transparent to the wavelength used), with additional details of exemplary application of such lasers are set forth further below. Further, as another optional process, an initial step of coating the substrate with an anti-reflective coating (step 810) may be performed prior to the placement and heating of the silicon materials on the substrate, as set forth in more detail above in association with FIGS. 8A and 8B.

Thin-Film Solar Cell Embodiments

FIG. 13 illustrates still another exemplary method of crystallizing silicon/silicon-based materials on substrate(s), consistent with aspects of the innovations herein. Referring to FIG. 13, an exemplary crystallization process including steps of doping the amorphous/poly material and covering the crystallized material with one or more metallization layers is disclosed. FIG. 13 also illustrates an initial series of steps, steps 910 and 920, consistent with FIG. 9. Specifically, initial steps of placing the seed layer and amorphous/poly material on the substrate 910 (in any order), and heating the seed layer/amorphous-poly material 920 into crystalline or partially crystalline form may be performed. Next, a step of doping the amorphous/poly material 1310 may optionally be performed. Here, for example, N and P dopants may be incorporated into the silicon or silicon-containing material for purpose of fabricating transistor or solar cell structures in such substrates. N and P dopants may be added before (1310A) or after (1310B) the crystallization of the amorphous/poly layer. Further, in certain implementations, addition of one of the dopants may be skipped entirely, such as the P-type dopant (Boron). According to some exemplary implementations, dopants may be added using a dopant paste and application of a laser on the regions where the dopants are to be incorporated. Other methods of dopant incorporation may be used in some implementations, including deposition of doped layers, such as a doped silicon layer. Additionally, an optional step of metallization 1320 may also be performed. In some implementations, for example, a dielectric layer such as silicon dioxide (SiO2) or silicon nitride (SiN) may be added. Here, the thickness of such layers may be between about 20 nm and about 20 µm, preferably about 500 nm (0.5 µm). Further, exemplary metallization layers Aluminum, Silver, other compositions including one or both of these metals, or other metal materials known in the art for use on thin film structures. Lastly, as another optional process, an initial step of coating the substrate with an anti-reflective coating (step 810) may be performed prior to the placement and heating of the silicon materials on the substrate, as set forth in more detail above in association with FIGS. 8A and 8B.

Figure 14:
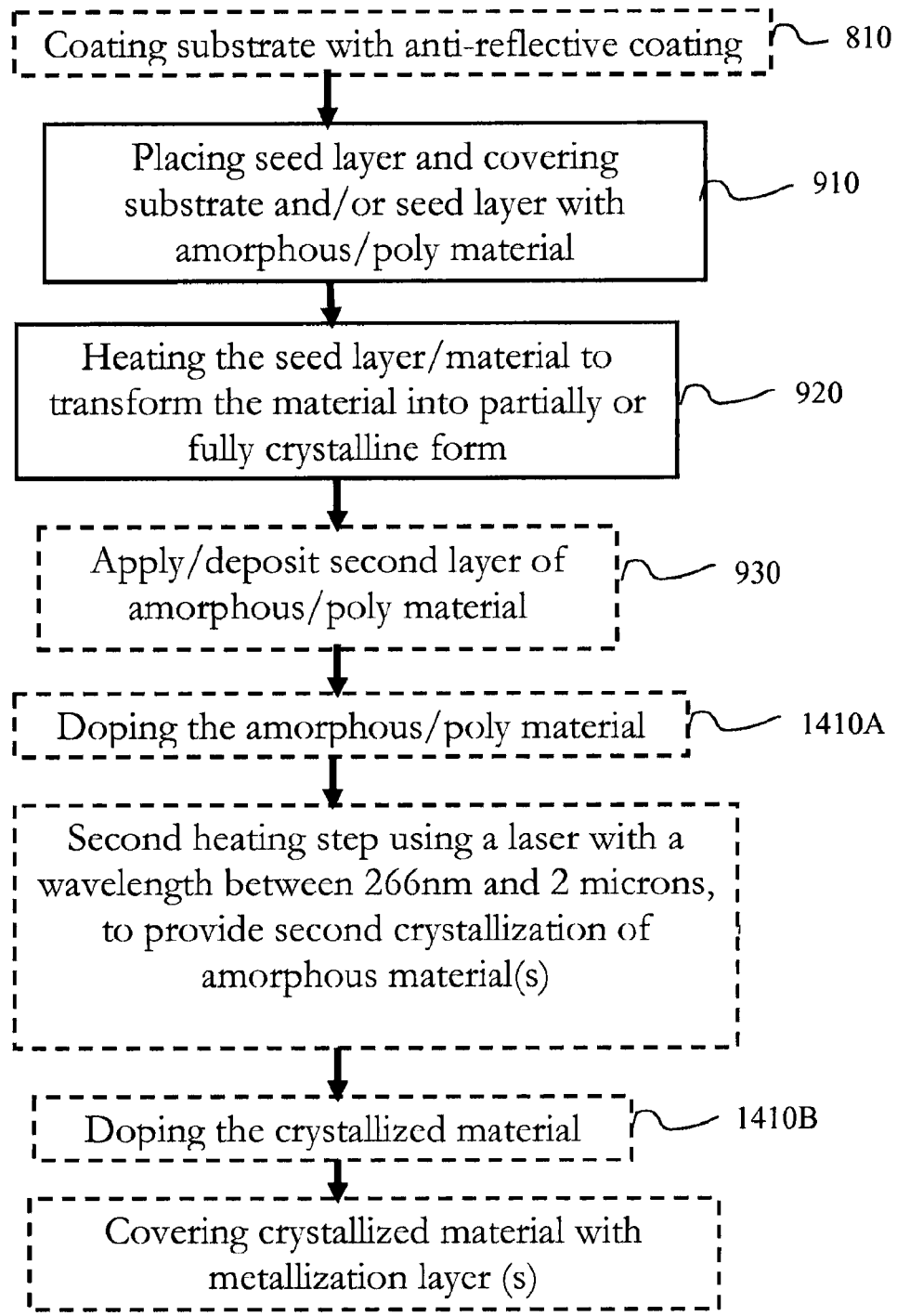

FIG. 14 illustrates yet another exemplary method of crystallizing silicon/silicon-based materials on substrate(s), consistent with aspects of the innovations herein. Referring to FIG. 14, an exemplary process including steps of doping the amorphous/poly material and covering the crystallized material with one or more metallization layers is disclosed. FIG. 14 also illustrates an initial series of steps, steps 910, 920 and 930, consistent with FIG. 9. Specifically, initial steps of placing the seed layer and amorphous/poly material on the substrate 910 (in any order), heating the seed layer/amorphous-poly material into crystalline or partially crystalline form 920, and applying/depositing a second amorphous/poly layer 930, may be performed. However, in FIG. 14, the step of coating/depositing a second layer of amorphous/poly material, step 930, is shown as an optional step because, in some implementations of the innovations herein, the later doping and/or metallization processes are performed in fabricating devices that have only a single layer of amorphous/poly material. Further, one or more doping steps (steps 1410A and 1410B) may also be optionally performed. Again, N and P dopants may be incorporated into the silicon or silicon-containing material for purpose of fabricating transistor or solar cell structures in such substrates. Methods including application/deposition of a second amorphous/poly layer may also include a second heating step, 1310, as set forth herein. Here, then, N and/or P dopants may be added before this heating/crystallization, step 1410A, or such dopants may be added after the heating step, to the crystallized material, step 1410B. Further, in certain implementations, addition of one of the dopants may be skipped entirely, such as the P-type dopant (Boron). And again, dopants in some implementations may be added using a dopant paste and application of a laser on the regions where the dopants are to be incorporated. Furthermore, an optional step of metallization 1320 may also be performed. In some implementations, for example, a dielectric layer such as silicon dioxide (SiO2) or silicon nitride (SiN) may be added. Here, the thickness of such layers may be between about 20 nm and about 20 µm, preferably about 500 nm (0.5 µm). Further, exemplary metallization layers Aluminum, Silver, other compositions including one or both of these metals, or other metal materials known in the art for use on thin film structures. Lastly, as another optional process, an initial step of coating the substrate with an anti-reflective coating (step 810) may be performed prior to the placement and heating of the silicon materials on the substrate, as set forth in more detail above in association with FIGS. 8A and 8B.

Figure 15A:
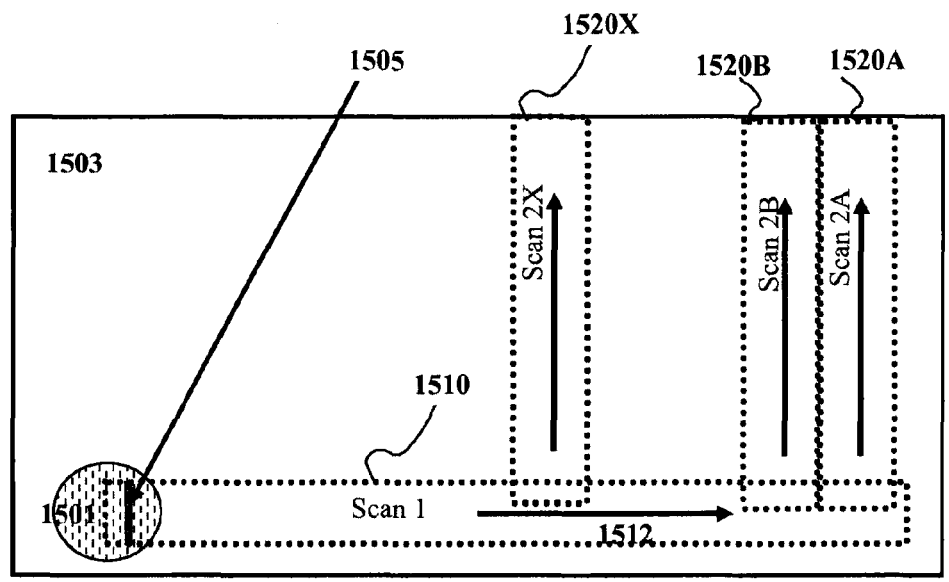
FIGS. 15A and 15B illustrate exemplary methods of rastering or scanning a laser over a substrate, consistent with aspects related to the innovations herein.
Figure 15B:
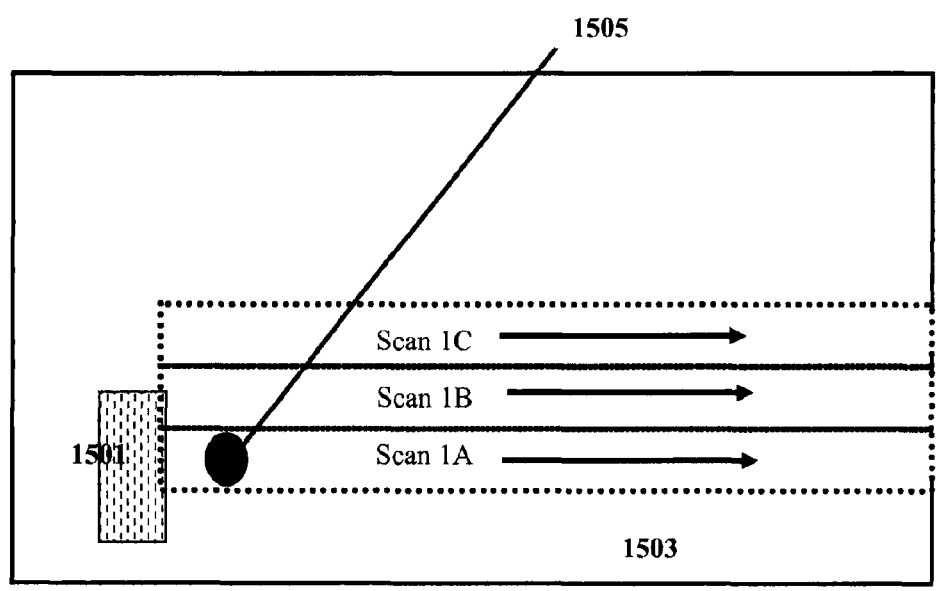

Referring to FIGS. 15A and 15B, exemplary methods of rastering or scanning of lasers over substrates, consistent with aspects of the innovations herein, are shown. FIGS. 15A and 15B are top view diagrams illustrating a base material 1503 to be crystallized (e.g., glass, etc.), a seed layer 1501, and a laser source 1505, which is shown as a line source though could also be, e.g., a spot source. Here, although depicted in one shape, the seed regions may be square, rectangular, circular, or other known shapes used for such seed region. Additionally, exemplary lasers/line sources used consistent with the innovations herein may include, with regard to the long axis, lasers with lines sources of between about 10 mm to about 500 mm, of between about 20 mm to about 80 mm, of about 80 mm, or of about 20 mm. Further, such line sources along the long axis may be 'flat top' sources where the intensity is constant along the long axis. With regard to the short axis, lasers with line sources between about 3 µm and about 100 µm, between about 5 µm and about 50 µm, of about 5 µm, or of about 20 µm. Further, along the short axis, the line sources used may be of standard Gaussian profiles (i.e., the intensity is not flat) although flat profiles may also be used.

Turning to the crystallization techniques shown in FIG. 15A, a first scan 1510 may be performed to crystallize a first zone 1512 along the length of the glass. Next, a series of subsequent scans (1520A, 1520B . . . 1520x) may be performed to propagate crystal over the entire glass sheet. Here, the quantity of scans needed may vary as a function of length of the laser line source. For example, with regard to a 1.3 m (1300 mm) substrate, given a line source of 20 mm, one must perform at least 65 scans to cover the entire glass.

Referring to the crystallization technique shown in FIG. 15B, a process for crystallizing amorphous/poly materials is disclosed. Here, for example, this technique is well suited for subsequent layers of amorphous/poly material, e.g., when an underlying (first) layer has already been crystallized or partially crystallized. (In such instances, it is not necessary to start the rastering or scanning at/over the seed layer, although this may certainly be done in some implementations.) According to one exemplary implementation, the laser source 1505 may be a spot source with a spot size of between about 10 µm to about 750 µm in diameter, or between about 200 µm and about 300 µm, or of about 250 µm. Finally, if the underlying layer has been adequately crystallized, the laser spot may simply be rastered across the whole substrate.

Flat Panel Display Embodiments

Figure 16:
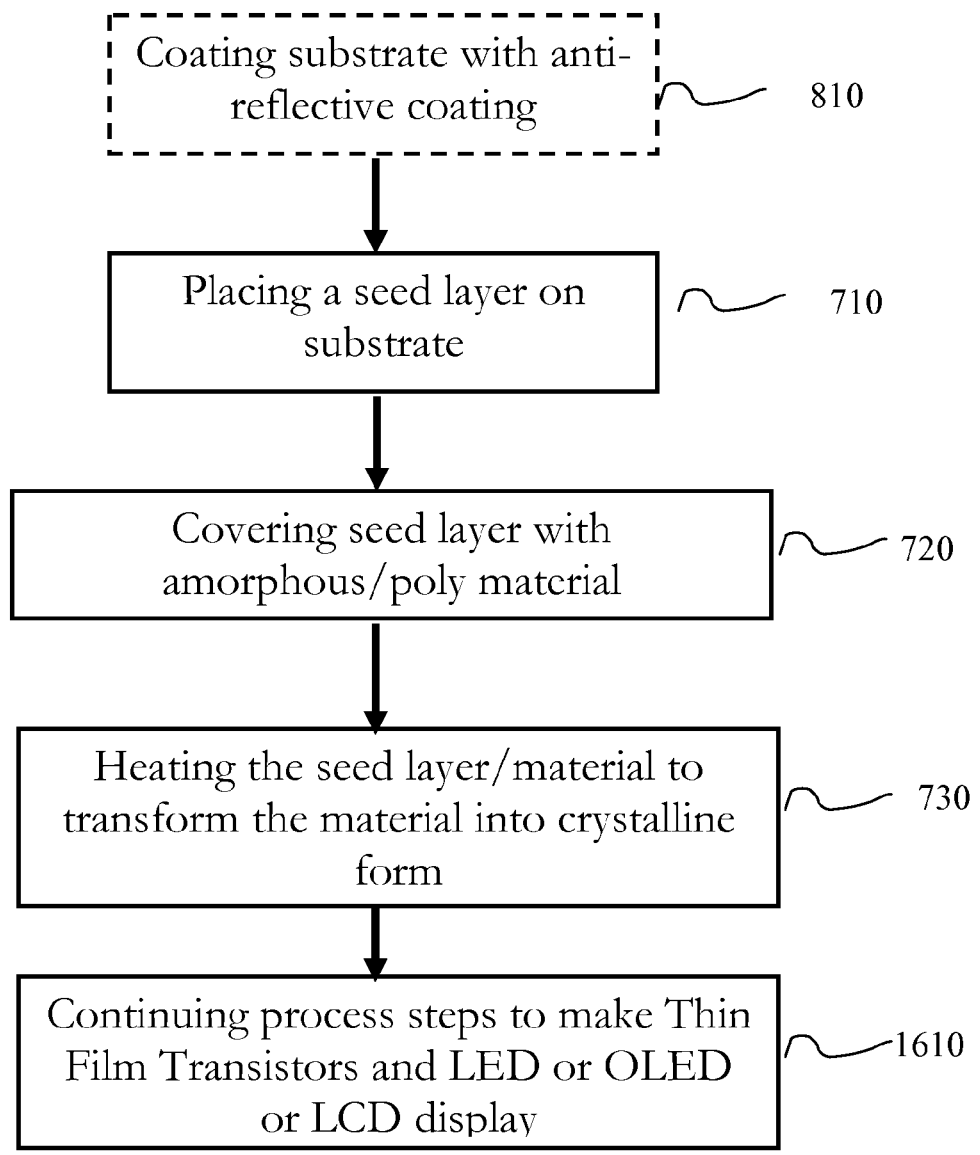
FIG. 16 illustrates yet another exemplary method including crystallization of amorphous/poly materials on a substrate, consistent with aspects related to the innovations herein.

FIG. 16 illustrates yet another exemplary method including crystallization of silicon/silicon-based materials on a substrate, consistent with aspects of the innovations herein. Referring to FIG. 16, an exemplary process including one or more steps related to fabrication of flat panel displays is disclosed. FIG. 16 illustrates an initial series of steps, steps 910 and 920, consistent with FIG. 9. Specifically, initial steps of placing the seed layer and amorphous/poly material on the substrate 910 (in any order), and heating the seed layer/amorphous-poly material 920 into crystalline or partially crystalline form may be performed. Next, in 1610, one or more further processing steps related to making thin film transistors and/or flat panel (LED, OLED, LCD, etc.) displays may be performed. Lastly, as another optional process, an initial step of coating the substrate with an anti-reflective coating, a stress-relief and/or contamination barriers (step 1620) may be performed prior to the placement and heating of the silicon materials on the substrate, as set forth in more detail above in association with FIGS. 8A and 8B.

Turning back to overall aspects of the disclosure, advantages of aspects of the current inventions may include innovations consistent with crystallizing amorphous or poly-crystalline materials, such as silicon or silicon containing materials, using a seed layer. Further, aspects of the present disclosure include innovations consistent with use of a silicon crystal as a seed layer to crystallize a base layer (e.g., amorphous/poly silicon, SiGe, SiC, etc.) on substrates, including glass. Further, systems, method and products consistent with the innovations herein may provide uniform grains, high carrier lifetime, and/or improved diffusion length, mobility, etc. In particular, as a result of the heating (e.g., laser irradiation, etc.) and use of seed layers herein, crystallized amorphous/poly layers consistent with the innovation herein have a grain size of greater than or equal to 10 microns.

With regard to some specific applications, such as solar cell applications in particular, use of the innovations herein with SiGe (silicon-germanium) increases the light absorption in the infrared region and therefore increases the efficiency of solar cells. In one exemplary implementation, a silicon-germanium layer with about 2 to about 5% germanium is used for the solar cell. Here, a silicon-germanium layer on top of a substrate such as glass may be crystallized as described above.

According to further aspects of the innovations herein, plastic or stainless steel base material is used as the substrate 1. For example, the use of plastic substrates along with these innovations enables low cost flexible solar cells which can be integrated more easily with, e.g., buildings. One exemplary use of plastic substrates with the innovations herein includes integrating solar cells with windows of commercial buildings (also known as BIPV or Building-integrated-photovoltaics).

It is to be understood that the foregoing description is intended to illustrate and not to limit the scope of the inventions herein, which are defined by the scope of the claims. Other implementations are within the scope of the claims.

The invention claimed is:

1. A method of fabricating a device, comprising:
    placing an amorphous layer of semiconductor material on a base substrate, wherein the base substrate is glass, plastic or steel;
    wherein the amorphous layer comprises silicon carbide material comprising silicon and carbon;
    heating the amorphous layer of semiconductor material with a pulse laser having a wavelength in an infra-red region of about 1.06 μm or 1.03 μm and a repetition rate above about 10 KHz to partially melt the amorphous layer of semiconductor material and transform the amorphous layer of semiconductor material into crystalline form;
    wherein the crystalline form of the amorphous layer of semiconductor material has a thickness of between 1 micron and about 4 microns.

2. The method of claim 1 wherein, the silicon carbide material comprises a layer between 20 nm and 1000 nm in thickness.

3. The method of claim 2 further comprising coating the base substrate with a coating before placing the amorphous layer thereon.

4. The method of claim 3 wherein the coating is an anti-reflective coating.

5. The method of claim 2 further comprising applying or covering the crystallized amorphous layer with a second amorphous layer.

6. The method of claim 5 further comprising heating the second amorphous layer to transform it into crystallized form.

7. The method of claim 2 wherein, as a result of the heat treatment via laser, the crystallized amorphous layer has an average grain size of greater than or equal to 10 microns.

8. The method of claim 1 wherein the amorphous layer of semiconductor material is deposited via a CVD deposition processes, or a PECVD process, or via sputtering.

9. The method of claim 1 wherein, as a result of the pulse laser heating process, the silicon carbide layer remains at least partially in a solid state.

10. The method of claim 1 wherein the silicon carbide material is doped with a N-type or P-type dopant material.

11. The method of claim 10 wherein the dopant material comprises Boron or Phosphorus.

12. The method of claim 1 wherein, the silicon carbide material comprises a layer between 20 nm and 1000 nm in thickness.

13. The method of claim 1 further comprising coating the base substrate with a coating before placing the amorphous layer thereon.

14. The method of claim 13 wherein the coating is an anti-reflective coating.

15. The method of claim 1 further comprising applying or covering the crystallized amorphous layer with a second amorphous layer.

16. The method of claim 15 further comprising heating the second amorphous layer to transform it into crystallized form.

17. The method of claim 1 wherein, as a result of the heat treatment via laser, the crystallized amorphous layer has an average grain size of greater than or equal to 10 microns.

18. A method of fabricating a device, comprising:
    placing an amorphous layer of semiconductor material on a base substrate;
    wherein the amorphous layer comprises silicon carbide material comprising silicon and carbon;
    heating the amorphous layer of semiconductor material with a pulse laser having a wavelength in an infra-red region of about 1.06 μm or 1.03 μm and a repetition rate above about 10KHz to partially melt the amorphous layer of semiconductor material and transform the amorphous layer of semiconductor material into crystalline form;
    wherein the crystalline form of the amorphous layer of semiconductor material has a thickness of between 1 micron and about 4 microns.

19. The method of claim 18 wherein the base substrate comprises a semiconductor substrate.

20. The method of claim 19 wherein, the silicon carbide material comprises a layer between 20 nm and 1000 nm in thickness.

21. The method of claim 19 wherein, as a result of the pulse laser heating process, the silicon carbide layer remains at least partially in a solid state.

22. The method of claim 19 wherein, the silicon carbide layer is doped with a N-type or P-type dopant material.

23. The method of claim 22 wherein the dopant material comprises Boron or Phosphorus.

24. The method of claim 19 further comprising coating the base substrate with a coating before placing the amorphous layer thereon.

25. The method of claim 24 wherein the coating is an anti-reflective coating.

26. The method of claim 19 further comprising applying or covering the crystallized amorphous layer with a second amorphous layer.

27. The method of claim 26 further comprising heating the second amorphous layer to transform it into crystallized form.

28. The method of claim 19 wherein, as a result of the heat treatment via laser, the crystallized amorphous layer has an average grain size of greater than or equal to 10 microns.

29. The method of claim 18 wherein, as a result of the pulse laser heating process, the silicon carbide layer remains at least partially in a solid state.

30. The method of claim 18 wherein, the silicon carbide layer is doped with a N-type or P-type dopant material.

31. The method of claim 30 wherein the dopant material comprises Boron or Phosphorus.

32. The method of claim 18 further comprising coating the base substrate with a coating before placing the amorphous layer thereon.

33. The method of claim 32 wherein the coating is an anti-reflective coating.

34. The method of claim 18 further comprising applying or covering the crystallized amorphous layer with a second amorphous layer.

35. The method of claim 34 further comprising heating the second amorphous layer to transform it into crystallized form.

36. The method of claim 18 wherein, as a result of the heat treatment via laser, the crystallized amorphous layer has an average grain size of greater than or equal to 10 microns.

37. A method of fabricating a device, comprising:
placing an amorphous layer of semiconductor material on a base substrate;
coating the substrate with silicon nitride;
heating the amorphous layer of semiconductor material with a pulse laser having a wavelength in an infra-red region of about 1.06 µm or 1.03 µm and a repetition rate above about 10 KHz to partially melt the amorphous layer of semiconductor material and transform the amorphous layer of semiconductor material into crystalline form;
wherein the crystalline form of the amorphous layer of semiconductor material has a thickness of between 1 micron and about 4 microns.

38. The method of claim 37 wherein the base substrate comprises a semiconductor substrate.

39. The method of claim 38 wherein, as a result of the pulse laser heating process, the silicon nitride layer remains at least partially in a solid state.

40. The method of claim 38 further comprising applying or covering the crystallized amorphous layer with a second amorphous layer.

41. The method of claim 40 further comprising heating the second amorphous layer to transform it into crystallized form.

42. The method of claim 38 wherein, as a result of the heat treatment via laser, the crystallized amorphous layer has an average grain size of greater than or equal to 10 microns.

43. The method of claim 37 wherein, as a result of the pulse laser heating process, the silicon nitride layer remains at least partially in a solid state.

44. The method of claim 37 further comprising applying or covering the crystallized amorphous layer with a second amorphous layer.

45. The method of claim 44 further comprising heating the second amorphous layer to transform it into crystallized form.

46. The method of claim 37 wherein, as a result of the heat treatment via laser, the crystallized amorphous layer has an average grain size of greater than or equal to 10 microns.

47. A method of fabricating a device, comprising:
placing an amorphous layer of semiconductor material on a base substrate;
coating the substrate with silicon oxynitride;
heating the amorphous layer of semiconductor material with a pulse laser having a wavelength in an infra-red region of about 1.06 µm or 1.03 µm and a repetition rate above about 10 KHz to partially melt the amorphous layer of semiconductor material and transform the amorphous layer of semiconductor material into crystalline form;
wherein the crystalline form of the amorphous layer of semiconductor material has a thickness of between 1 micron and about 4 microns.

48. The method of claim 47 wherein the base substrate comprises a semiconductor substrate.

49. The method of claim 48 wherein, as a result of the pulse laser heating process, the silicon oxynitride remains at least partially in a solid state.

50. The method of claim 48 further comprising applying or covering the crystallized amorphous layer with a second amorphous layer.

51. The method of claim 50 further comprising heating the second amorphous layer to transform it into crystallized form.

52. The method of claim 48 wherein, as a result of the heat treatment via laser, the crystallized amorphous layer has an average grain size of greater than or equal to 10 microns.

53. The method of claim 47 wherein, as a result of the pulse laser heating process, the silicon oxynitride remains at least partially in a solid state.

54. The method of claim 47 further comprising applying or covering the crystallized amorphous layer with a second amorphous layer.

55. The method of claim 54 further comprising heating the second amorphous layer to transform it into crystallized form.

56. The method of claim 47 wherein, as a result of the heat treatment via laser, the crystallized amorphous layer has an average grain size of greater than or equal to 10 microns.

* * * * *